United States Patent [19]

Beckwith

[11] Patent Number: 5,315,527
[45] Date of Patent: May 24, 1994

[54] METHOD AND APPARATUS PROVIDING HALF-CYCLE DIGITIZATION OF AC. SIGNALS BY AN ANALOG-TO-DIGITAL CONVERTER

[76] Inventor: Robert W. Beckwith, 2794 Camden Rd., Clearwater, Fla. 34619

[21] Appl. No.: 816,242

[22] Filed: Jan. 3, 1992

[51] Int. Cl.⁵ ........................ G06F 15/20; G01R 21/00
[52] U.S. Cl. .................................... 364/483; 364/487; 324/76.77; 307/236
[58] Field of Search ............... 364/481, 483, 492, 487; 324/76.39, 76.52, 76.55, 76.75, 76.77, 76.82; 307/236; 341/127, 131

[56] References Cited

U.S. PATENT DOCUMENTS

| | | |
|---|---|---|
| 3,737,893 | 6/1973 | Belet et al. ........................ 307/236 |
| 4,654,586 | 3/1987 | Evans, Jr. et al. ................ 324/76.82 |
| 4,884,021 | 11/1989 | Hammond et al. .................. 364/483 |

Primary Examiner—Thomas G. Black
Assistant Examiner—Michael Zanelli
Attorney, Agent, or Firm—Led J. Aubel

[57] ABSTRACT

A circuit, and a processing and calculation method that makes use of the digital samples of either the positive or negative half-cycle of voltage or current signals to achieve a sixteen to one improvement in accuracy for controls connectable to an electrical utility system.

13 Claims, 15 Drawing Sheets

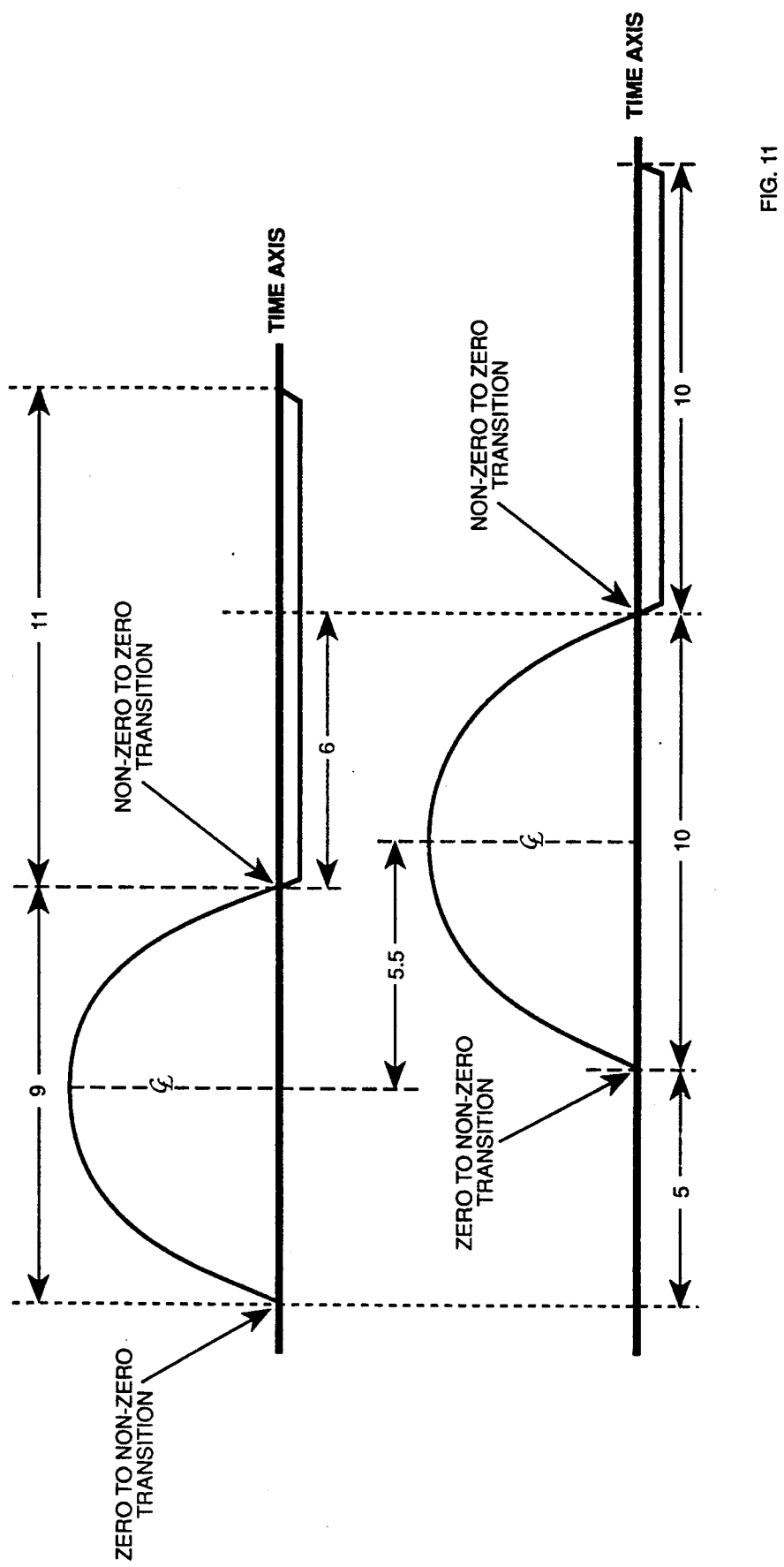

METHOD AND APPARATUS PROVIDING HALF-CYCLE DIGITIZATION OF AC SIGNALS BY AN ANALOG-TO-DIGITAL CONVERTER

BACKGROUND OF THE INVENTION

(a) Controls for Electric Power Apparatus

The general arrangement for control of electric power apparatus in electrical utility power systems is shown in FIG. 1. This apparatus responds to some criteria, including amplitude, of voltage or current signals or both. If two or more input signals are required for a specific application, the phase relation between any two may also be included in the criteria. For purposes of this document, "control" means the timely response to varying measurements in an electrical utility power system, and not to the instantaneous response sometimes required to protect against damage from fault or short-circuit conditions in such systems. Controls may require only one alternating current voltage signal input, such as for use in power factor capacitor controls, which are connected to or removed from electrical power distribution circuits in response to the magnitude of the distribution voltage. Another control for use on a three-phase, four-wire electric power circuit may require three voltage and three current input signals for response to three-phase watts or vars. A simplified version of a control for the same purpose could use one voltage and three current input signals, where it is assumed that the voltages are equal and 120 degrees apart in relative phase angle.

The voltage signal input to the prior art control 17 is from a potential device 14; such as a voltage transformer, capacitor potential device, or a resistive potential device. The current signal inputs, if required, are obtained from sensing device 16, such as a current transformer or line current sensor. Current sensors are air core coils held by an insulator in close proximity to an electric power conductor. The coil picks up a voltage from the magnetic field produced around the conductor by the current flowing in the conductor. Additional potential devices, collectively numbered 13, and current transformers or sensors, collectively numbered 15, are shown to indicate that they may be required depending on the functions of the specific control 17, as described previously.

Control 17 uses one or more output relays, collectively numbered 18, which typically close their output circuit to actuate power system apparatus 19. For example, assume apparatus 19 is the switch mechanism to activate the "raise" or "lower" motor starters of a load tapchanging transformer. In this example, control 17 would have a "raise" output relay and a "lower" output relay 18, which would close accordingly to actuate the "raise" or "lower" motor starters, respectively. In response to the relay conditions, the motor would either raise or lower the tap position to raise or lower the voltage from the transformer. Another example would be "close" and "trip" output relays 18 that would control a power factor capacitor "connect" and "disconnect" switch, which would be used to bring the capacitor on and off line, respectively.

(b) Analog Input Circuits

Voltage and current signals as derived for power system control approximate sine waves and are bipolar with essentially no dc component. One method of preparing these signals for connection through an analog-to-digital converter (ADC) to a microprocessor is to use analog circuitry to produce a dc voltage proportional to the current or voltage signal. While the voltage and current signals may approximate sine waves, they do contain harmonics, and therefore the analog circuit may be designed to produce an output proportional to the fundamental, to the rms content, to the average or to the peak of the signal. The disadvantage of this design is that once the analog input circuit exists, it is difficult to change to another of these four designs, or to some other factor of the actual signal.

It should be noted that the ADC discussed here may be a separate device or a circuit comprising discrete components, or the ADC may be incorporated in a microprocessor or microcomputer, as in the preferred embodiment.

In general, where there are two or more signals representing voltage or current, it is necessary to determine the phase relation between the signals, using one signal as the reference. In the method described above, a second input of each signal to the microprocessor is required where the signal is limited in amplitude and where these inputs are interrogated frequently so as to obtain the time difference between zero-crossings as the measure of the phase between each input and the designated reference. This prior art method has the disadvantage that signal harmonics cause errors in the zero-crossing times and thus errors in the phase information obtained. Moreover, a catastrophic error occurs if the harmonic content is sufficient to cause more than the two expected zero crossings per cycle.

The analog circuit that is used to detect magnitude can be designed so that the maximum expected dc voltage falls just under the saturation voltage of the ADC, thus effecting the best possible accuracy of the digital number produced. This accuracy may, however, be offset by the errors and drift in the analog circuitry required by this prior art method.

(c) Sampled Input Circuits

It is possible to avoid the cost and inherent errors in the analog circuits used to prepare the amplitude and phase information inputs by connecting the voltage or current signals directly to the ADC inputs, sampling these inputs a number of times per cycle and then using mathematical means to obtain the phase and amplitude information.

Whenever an analog signal is passed to an ADC, it is necessary to consider the range of magnitude of the signal which must correspond to the linear range of the ADC so as to prevent saturation of the desired analog signal at either the positive or negative end of its linear range.

Stated in other words, in power signals, values are assigned to voltage and current inputs to represent one per unit of the primary voltage or current, which are typically 120 volts ac and 0.2 amps ac at the levels that are input to a control. That is, 120 volts ac equals 1 per unit (p.u.) voltage and 0.2 amps ac equals 1 p.u. current. A reasonable rule of thumb used by many design engineers is that linearity is required up to 20% over the one per unit values, assuming a sine wave, or 1.2 p.u. This process of design is referred as scaling and may involve consideration of transformer ratios, resistor networks, current transformer burdens and change in amplitude in filters, so that the range of the input signal over which linearity is required corresponds to the linear range of the ADC. Burden is defined herein as the load on any current transformer. Scaling generally involves analog components with their inherent tolerances. Since the requirements for scaling have some degree of approximation, these tolerances are acceptable, in terms of avoiding saturation, since this phenomena only occurs when the input goes outside of the range required for linearity (i.e., nominal +20%).

Functions of controls, such as 17, may require accuracies better than 1%, and often this is obtained by using variable analog devices such as trimpots. These added components however, increase the cost, decrease the reliability, and may detract from the temperature stability of the device. An alternative method to achieve the required accuracy without variable analog devices is to input one per unit levels of all signals simultaneously, all with no phase differences. A mathematical calibration procedure can then be used to store magnitude multipliers and phase angle correction factors in such a way that these can be used in any subsequent calculation so that the input signals are error-free representations of the primary voltages and currents.

In order to digitize such signals in an ADC, it has been necessary to apply each signal so that the peak-to-peak bipolar signal voltages fall on the linear portion of the ADC. Commonly available ADCs, however, have a monopolar characteristic, typically falling from 0 to +5 volts. It is necessary, therefore, to provide a zero reference of one-half of the ADC reference voltage; for example, a zero reference of 2.5 V dc for an ADC reference voltage of 5 V dc; and then use an isolating transformer or equivalent means to connect the bipolar signal to the 2.5 V dc as its zero reference; note FIG. 2.

FIG. 2 illustrates a typical prior art voltage and current input circuit used to take a complete bipolar oscillatory wave signal into the ADC described above. Typically, the voltage input would be from a 120 V ac voltage transformer 20 to auxiliary transformer 22. The secondary of transformer 22 would be scaled to the linear range of ADC 37. Typical of any digital sampling scheme, samples are taken (measured), say, 16 times per cycle, and it is necessary to suppress harmonics whose order is at or above the sampling rate divided by two. For example, with 16 samples per cycle, harmonics that could exist at the eighth order and above must be removed before a signal is connected to ADC 37. A filter for this purpose is commonly referred to as an anti-aliasing filter, and is used to avoid aliasing or the incorrect assimilation or interpretation of harmonic frequency components in the circuit. Therefore, in FIG. 2, each scaled voltage and current signal is input into well known anti-aliasing low-pass filters (AAF) 29 and 30, respectively. The harmonic order equal to the sampling rate divided by two is known as the anti-aliasing cut-off frequency.

Resistors 23 and 24 are connected in series between AAF 29 and ADC 37. The anode of diode 25 is connected to the cathode of diode 26 and to the junction of resistors 23 and 24. The cathode of diode 25 is connected to a 5 volt dc source. The anode of diode 26 is connected to ground. Protective diodes 25 and 26 prevent the input to ADC 37 from going above 5 volts or below zero volts, or at least not by more than the forward drop across diodes 25 and 26. Limiting of the voltage to ADC 37 by diodes 25 and 26 would only be expected by an abnormally high input voltage, in which case the diode currents would be limited by resistor 23. Resistor 24 limits the current into ADC 37 to a safe value when unusual voltage conditions do cause either diode 25 or 26 to conduct, thereby protecting both the protective diodes 25 and 26, as well as ADC 37. A dc voltage source is required for the 5 volts dc reference 35 and the 2.5 volts dc bias 36.

The input for a current signal in FIG. 2 is identical to the one for the voltage input, except that the input is from a current transformer 21 or other known current sensing device, and a suitable auxiliary current transformer 27 with typically a 0.2 A primary would be used in place of voltage transformer 22. Resistor 28, connected across the secondary of transformer 27, is scaled to ADC 37, as described above. Similar to the voltage input circuit, diodes 33 and 34 with resistors 31 and 32 perform the limiting and protective functions for the current input circuit.

The circuit of FIG. 2 adds 2.5 volts to the voltage and current signals fed to ADC 37. It is therefore necessary to scale these signals so that a negative sine wave peak does not exceed 2.5 volts, which would cause ADC 37 voltage to go negative, or that a positive peak does not exceed 2.5 volts, which would cause ADC 37 voltage to exceed 5 volts. The 2.5 volt bias 36 is chosen as one-half of the 5 volt reference 35 so that the scaling will simultaneously limit the positive and negative saturation, assuming a sine wave signal. If ADC 37 is 8-bit, these 8-bits would be assigned to the peak-to-peak voltage of any input signal. Since these eight bits resolve the entire waveshape into $2^8$ equal increments or 256 increments, only half of which are assigned to either the positive or negative half-cycle, the result is that each half-cycle is resolved into $2^7$ increments or 128 increments or a 7 bit resolution.

The designers task, therefore, is to most effectively overcome this inherent limitation of commonly available analog-to-digital converters to improve resolution and accuracy of control devices. The inventive circuits described hereinafter are directed to such an application.

SUMMARY OF THE INVENTION

A circuit for use in a device for control of electric power apparatus connectable to either a single-phase or three-phase alternating current electrical utility system. The circuit and accompanying method of sampling and computation includes means to selectively use only the positive or only the negative half-cycle of the voltage or current signal by an analog-to-digital converter for digital processing of the information by a microprocessor. The circuit also includes means to use the opposite half-cycle from that used for sampling to power the microprocessor and other circuits with preselected voltage, such as +5 volts, and means to supply preselected voltage, such as −5 volts, when required by application of the control. Capacitance may be used as a current transformer burden to provide desirable filtering of the current signal prior to rectification of the signal. The invention and accompanying method of sampling and computation simplifies the circuitry, reduces the number of components and improves the resolution by a factor of 16 in the preferred embodiment.

The foregoing features and advantages of the present invention will be apparent from the following more particular description of the invention. The accompanying drawings, listed hereinbelow, are useful in explaining the invention.

DESCRIPTION OF THE DRAWINGS

FIG. 11 is a graphical representation depicting the computation of the digitized samples of the positive half of two waveforms to determine phase angle, using the inventive sampling and computational method.

DESCRIPTION OF THE INVENTION

Figure 3:
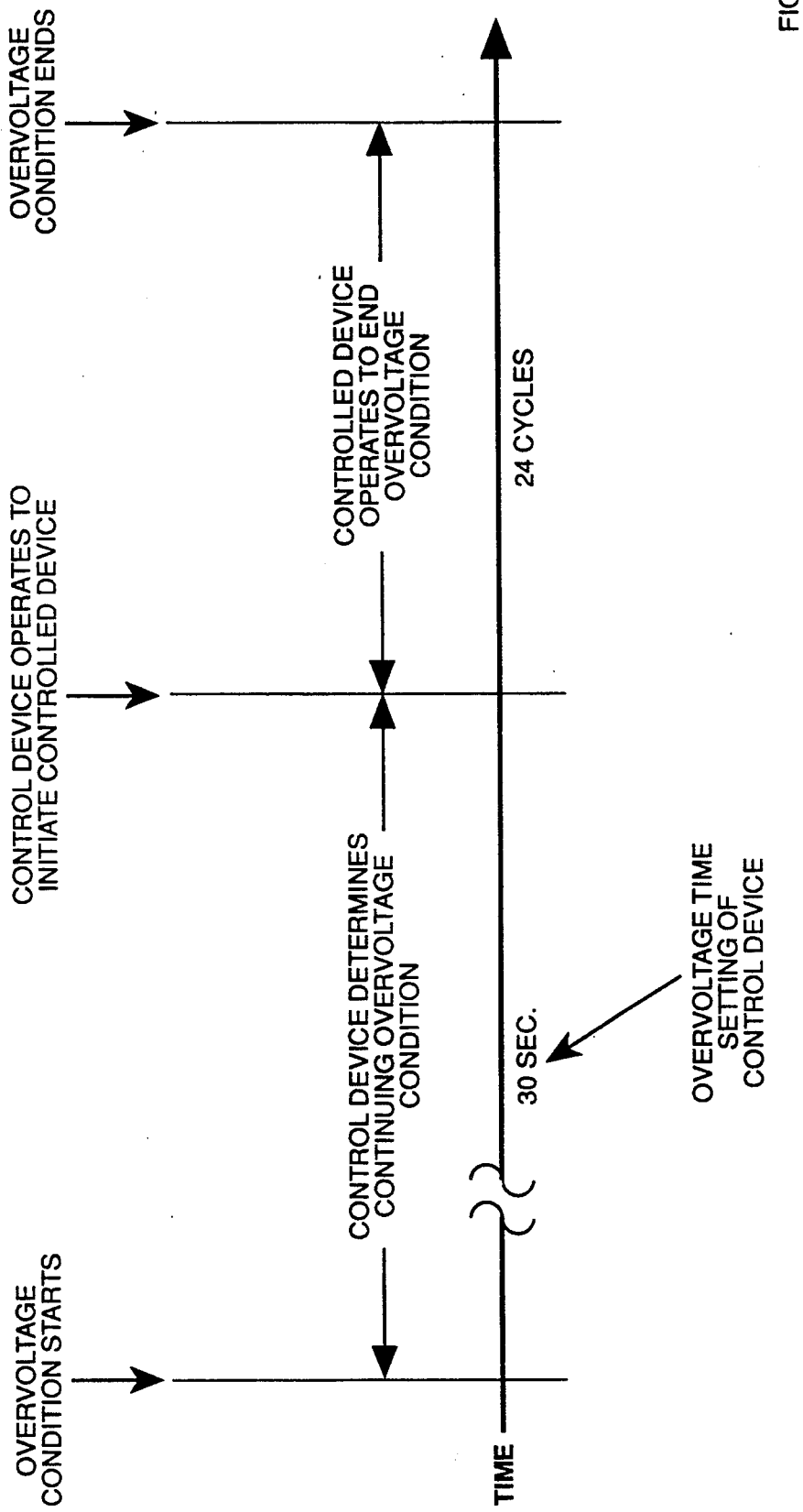
FIG. 3 is a time line that illustrates an example of a slowly varying input typical of the inventive device and method.

As alluded to briefly above, the term, "control" is illustrated in FIG. 3 by an example typical for the present invention. For the purposes of this example, assume that the present invention is used as part of a control relay for a load tapchanging transformer, as described previously. Starting on the left-hand side of FIG. 3, the first vertical line represents the time when an overvoltage condition occurs, as might be caused by load being dropped from the electrical power circuit. Assume that the control device has an overvoltage time delay set to 30 sec., which is the time that the control will allow the overvoltage condition to exist before it closes its "lower" output relay to cause the "lower" motor starter to begin lowering the voltage from the transformer. Therefore, the control device will sense the overvoltage condition, but will not begin to operate until the time delay interval ends, as shown by the second vertical line. The interval between the second and third vertical line, 24 cycles in this example, represents the time that the controlled device, in this case, the "lower" motor starter of the transformer, operates to lower the voltage. The overvoltage condition ends when the "lower" motor has caused the transformer to decrease the voltage to a level that is within the preset limits of the control device, which is indicated in FIG. 3 by the third vertical line.

As can be seen by this illustration and defined herein, I do not mean a fault condition, where drastic changes in magnitude and waveshape occur within a single cycle. These changes may be required to be detected by a fast protective relay device in one cycle or less, and significant information concerning the fault may be found in one or more cycles. Control, on the other hand and as herein considered, relates to analysis of a signal, where measurable change occurs between two or more cycles.

As will be seen herein, this invention is applicable to the more slowly changing parameters depicted in FIG. 3, such as would be used to control load tapchanging transformers of for controlled switching of power factor capacitors. Similarly, this invention would be useful for slower protective relays designed to respond to time overcurrent, time under- or overvoltage, volts per hertz, under- and overfrequency, and overload conditions. Obviously, the example of FIG. 3 is not intended to be limiting, since the time periods may be shortened or extended depending on the control device applications.

Figure 4:
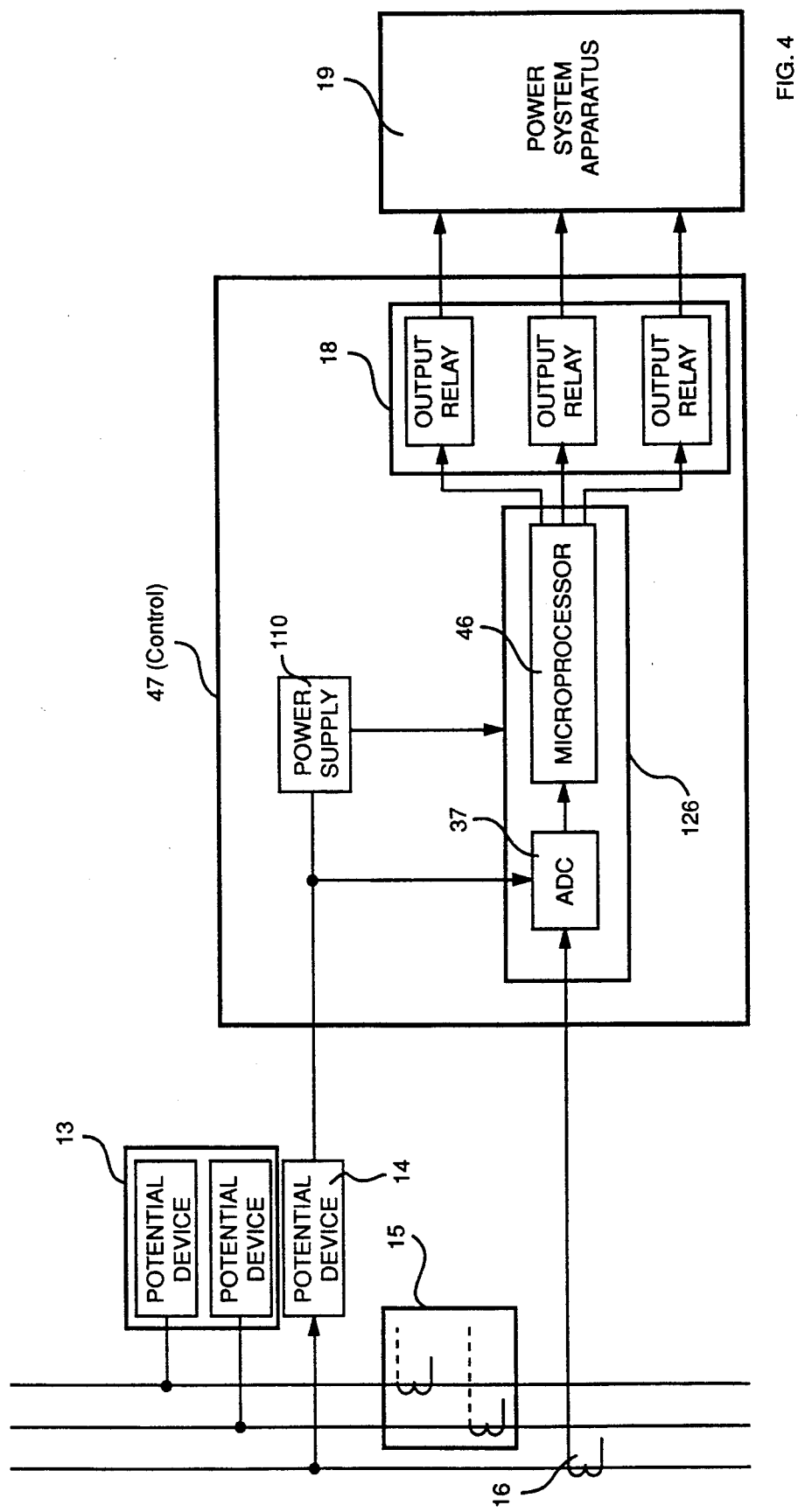
FIG. 4 is a block diagram of the inventive control circuitry with a single voltage and a single current input.

Refer now to FIG. 4, which shows a block diagram of the preferred embodiment of the inventive circuitry with a single voltage and a single current input. When used with an inventive sampling and computational method to be described herein later, the combination forms a nearly perfect half-cycle rectifier. As a brief overview, the voltage input signals to be coupled to one of the family of Motorola M68HC11 device 126, which contains an ADC function 37 and a microprocessor function 46, are obtained from a potential device 14 as in the prior art method described above. The current signals to be coupled to device 126 are obtained from a current transformer or other current sensing device 16, also as in the prior art method. Each scaled voltage and current signal is fed to the inputs of ADC 37. In the preferred embodiment, ADC 37 has built-in sample-and-hold circuitry to hold the analog signals during analog-to-digital conversions. The microprocessor 126 performs three basic functions: 1) reading and storing values of the samples, 2) calculating quantities from the samples using the inventive method to be described herein later, and 3) calculating quantities and performing logic for the control functions. The results would determine when to initiate action of the output relays 18 and ultimately of the power system apparatus 19, both of which could be the same as those used in prior art designs.

Power for device 126 is supplied by inventive power supply 110, described in detail later, which also can provide power for other circuits, as required.

The present invention uses the concept of selectively using only the positive half-cycle or only the negative half-cycle of the voltage or current signal by an analog-to-digital converter and microprocessor to sample and compute information required for operation of control 47.

Note that since most common ADCs, such as that included in device 126, are designed to respond only to positive voltages, all circuits that will be shown will sense the positive half-cycle of the input signal. Hereinafter, this half-cycle will be referred to as the "sensed" half-cycle, and the other half-cycle (displaced 180 degrees from the sensed half-cycle) will be referred to as the "alternate" half-cycle.

Figure 5:
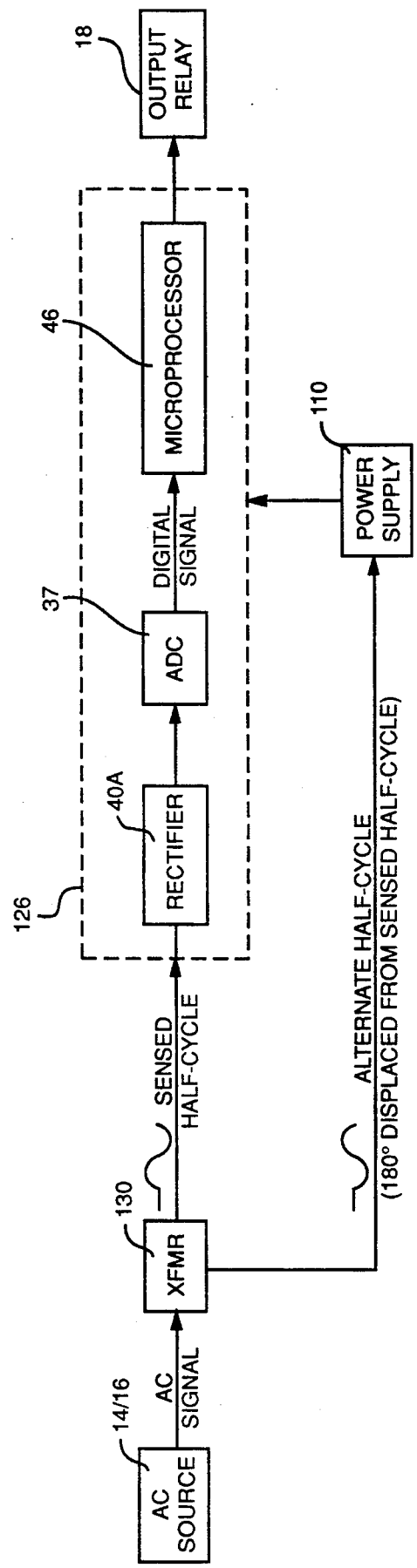
FIG. 5 is a flow diagram of the inventive control circuitry.

The concept of using only the positive half-cycle as the sensing input to the ADC 37 and microprocessor 46 will be explained by reference to FIG. 5. Starting at the left side of this figure, it can be seen that the design derives the ac signal (voltage or current) from the alternating current source 14/16, depending on the application requirements of control 47. This signal is fed to transformer 130, which sends the sensed half-cycle to the rectifier 40A function of the design, and the alternate half-cycle to power supply 110. Rectifier 40A derives the positive half-cycle of the signal, which is then fed to the ADC 37 function of device 126. The digital signal produced by ADC 37 is then sent to microprocessor 46, where computation of the digital samples occurs. The sampling and computational method will be described hereinlater. The application of the circuitry shown in FIG. 5 would determine when the circuitry and method would determine when to operate output relay 18, as described previously.

There are several advantages to this design:

1) Using only one-half of the cycle for sampling and utilizing a computational method for the ac signal together affords higher resolution than prior art.

2) The number of external components to the microprocessor is minimized by maximizing computational methods as compared to prior art.

3) More efficient use is made of the rectifier 40A function of device 126 by using it to protect against abnormal excursions of the analog inputs of device 126, as well as to block out the negative portion of the ac input signal.

4) Less memory storage is required of the microprocessor function of device 126 than with prior art designs and methods.

The circuit for this design will be shown in detail in FIG. 6, and the further advantages will be described in detail hereinlater.

Refer again to FIG. 5. The inventive design also includes means to use the alternate half-cycle through power supply 110 to furnish power to device 126. In this manner, the voltage drop in common elements, such as input transformers, caused by the alternate cycle power supply current does not affect the accuracy of the sensed half-cycle portion of the ac signal fed to the ADC 37 function of device 126. This circuit will also be shown in detail in FIG. 6.

Figure 6:
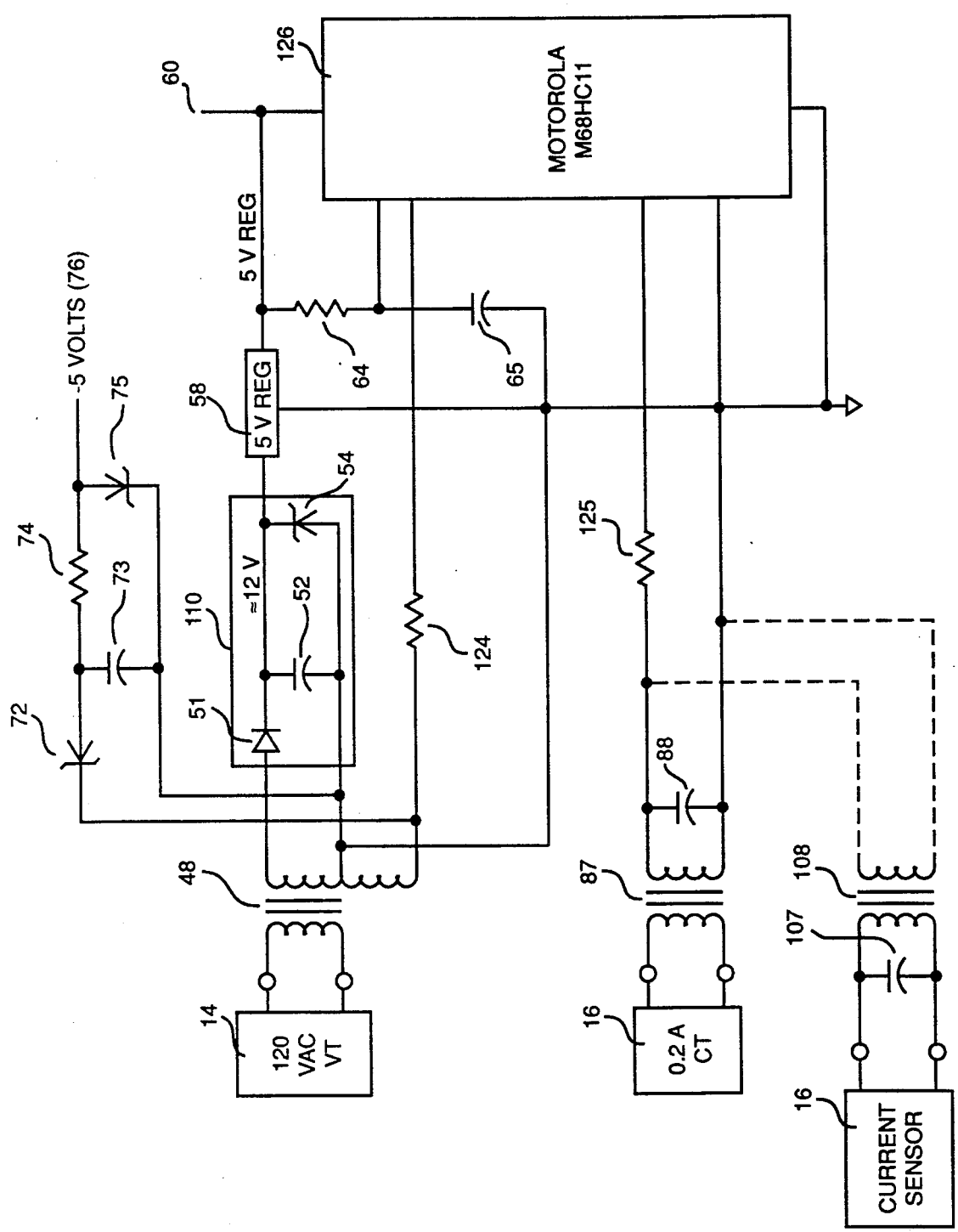
FIG. 6 is a schematic diagram depicting the preferred embodiment of the inventive half-cycle rectification circuitry.

Refer now to FIG. 6 for a description of the components and circuitry of the preferred embodiment. This figure shows input means to couple the voltage and current information to device 126 for digitization and computation in control 47, as shown in block diagram form in FIG. 4, and in the flow diagram of FIG. 5.

Commonly available ADC devices, either separately or when incorporated in devices such as 126, have a positive power supply input, negative power supply input, high voltage reference and low voltage reference inputs, as well as one or more signal inputs. In all of the circuits shown in the following figures, the scaling is designed so that the entire range of ADC 37, from the low voltage reference to the 5 volt high voltage reference, is filled with the sensed portion of the cycle of each input signal, rather than filling the 5 volt dc range with both halves of the cycle, as in the prior art sampling input method. Thus the inventive circuits shown in FIG. 6 provide $2^8$ or 8-bit resolution for one-half of the cycle, which results in a two to one improvement in accuracy over the prior art full-cycle method of FIG. 2.

In all of the circuits depicted herein, the capacitors shown as current transformer burdens, 88 and 107, are low-loss plastic film, as used in Mylar (tradename of DuPont) or equivalent capacitors. These have such low-loss characteristics that even though the phase relation between the current and voltage across a capacitor may vary two to one with temperature with a resultant change of 0.1 to 0.2 degrees, any such small angle is insignificant in the overall accuracy of the circuit. Other types of capacitors with higher-loss characteristics may vary correspondingly from 5 to 10 degrees. Although this variation could be compensated for mathematically by the microprocessor function in device 126, a means to track the variation with temperature would be required. This additional step, and related temperature-sensing components required, are eliminated by using Mylar or equivalent capacitors for all of the burden capacitors shown.

The voltage input to circuits shown in FIG. 6 would be from potential device 14 of some higher input voltage, whose output voltage is nominal 120 volts ac to transformer 48, which provides a grounded tapped secondary. One terminal (top for the purposes of this illustration) of the secondary of transformer 48 provides positive alternate half-cycles of the input to the inventive power supply circuit 110, which will be described hereinlater. Another terminal (bottom for purposes of this illustration) of the secondary of transformer 48 provides positive sensed half-cycles of the input through resistor 124 to the signal input of the ADC function in device 126.

The preferred microprocessor device 126 is one of the Motorola M68HC11 family. Several members of this family of microprocessors, including device 126, have a self-contained ADC and zener diodes to protect each analog signal input. These zeners conduct for positive voltages of approximately 20 volts, and the microprocessor of device 126 is not harmed by voltages up to this conduction level. In the negative direction of each analog input, the voltage is held to about 0.7 volts by the forward diode conduction, which is rated to conduct at least 25 milliamps without damage to the diodes, ADC or microprocessor on device 126. A series resistance from 1,000 to 10,000 ohms is suggested by the manufacturer of device 126 for each analog input, with 1,000 ohms recommended, since a 20 volt excessive ac voltage input will not exceed the positive voltage limit, and will produce a safe 20 milliamps in the negative direction. As shown in the preferred embodiment of FIG. 6, the value for resistors 124 and 125 will therefore be 1,000 ohms. With an input impedance to ADC 37 in device 126 in the order of 2.5 megohms, the input signal voltage drop across either resistor 124 or 125 is an insignificant drop in the sensed half-cycle of 40 parts per million.

If the current input to control 47 is supplied by a current transformer 16, the current signal for device 126 is obtained from the secondary of current transformer 16 and is connected to the input of auxiliary current transformer (ACT) 87. Since most controls, such as control 47, should respond to the fundamental component of the current signal, capacitor 88, scaled to give a peak voltage of 5 volts, is connected across the output winding of ACT 87 as burden. The junction of one terminal (top for purposes of this illustration) of 87 secondary and the positive end of capacitor 88 is connected through resistor 125 to the signal input of the ADC function in device 126. The circuit ground connection is formed by the junction of the bottom terminal of ACT 87 secondary, the negative end of capacitor 88, the ground connection of 5 volt regulator 58, and the low voltage reference and negative power inputs to the ADC function of device 126.

Since the source impedance feeding a current yransformer, such as 16, is essentially infinite, the use of a capacitor burden in FIG. 6 provides 6 decibels of attenuation per octave for current harmonics. Thus, capacitor 88 provides a more nearly perfect sine wave fundamental than if a resistor were used as burden, as in prior art. This improves the accuracy of the algorithm required to detect the fundamental component of the current waveshape in applications where this is desirable.

A second advantage to using capacitor 88 as burden is that no anti-aliasing filter is required, since the attenuation provided by capacitor 88 is more than adequate in providing the anti-aliasing function. This greater filtering of harmonics also reduces harmonics between the power frequency and the previously defined anti-aliasing cut-off frequency. Very non-linear power system loads produce very distorted current waves which contain high signal harmonics. It is desirable to reduce the effect of the current signal harmonics when determining the signal amplitude and the signal phase angle in relation to another signal as reference. The inventive use of capacitor 88 eliminates the components that would normally be required to perform the anti-aliasing function, and at the same time, improves the accuracy of current signal amplitude and phase relationship calculations.

Capacitor 88 in this circuit does give nearly 90 degrees of phase shift and, in the prior art analog control 17, this could be a considerable disadvantage. As used by the microprocessor function of device 126 in the improved control 47, however, this is easily corrected by known computational methods.

FIG. 6 also shows the circuitry required if a current sensor is used as the current sensing device 16, described previously, to bring the current signal into device 126. One disadvantage of a current sensor as a current sensing device 16 is that the voltage output to auxiliary current transformer (ACT) 108 is the differential of the electric power current. Since this differentiation causes a 6 decibel per octave increase in harmonics, the integrating and anti-aliasing filters of prior art must overcome this increase in harmonics, and at the same time produce the additional attenuation normally required to overcome the aliasing effect.

In the inventive improvement shown in FIG. 6, capacitor 107 is connected in parallel to the outputs of current sensor 16. The parallel connection of sensor 16 and capacitor 107 is further paralleled with the primary of ACT 108, whose secondary scales the peak voltage of 5 volts dc into the ADC function of device 126. The rest of the circuit depicted for the current sensor input is the same as that of the circuit for the current transformer.

Capacitor 107 resonates the coil of current sensor 16 at a frequency substantially below the 60 Hz electric power frequency, for example, at one-half the frequency. At resonance, the integrating effect of the capacitance of 107 cancels the differentiating effect of sensor 16. At higher frequencies, the capacitance causes a filtering effect, so that from the 60 Hz power frequency and higher, harmonics are reduced. Capacitor 107 therefore plays the additional role of acting as an anti-aliasing filter, as well as a harmonic filter.

Capacitor 107 therefore eliminates the components that would normally be required to perform the integrating and anti-aliasing functions. In addition, by reducing current signal harmonics, capacitor 107 improves calculations of signal amplitude and phase relationship, increasing the accuracy of control 47.

The inventive power supply circuit 110, also shown in FIG. 6, illustrates powering device 126 and other circuits 60 on half-wave current during the alternate half-cycle of that fed to the signal input of the ADC function in device 126 through resistor 124. In this way, the voltage drop in common elements, such as transformer 48, caused by the power supply current does not affect the accuracy of the sensed half-cycle fed to the ADC function in device 126. Power supply circuit 110 is formed by diode 51, capacitor 52, and zener diode 54. The input to power supply 110 is from the top terminal of transformer 48 to the anode of diode 51, which conducts the positive half cycles of the input to the junction formed by capacitor 52, the cathode of zener diode 54, and the input to the 5 volt regulator 58. Zener diode 54 is 15 volts and protects capacitor 52 from voltage over 15 volts during abnormally high excursions of the nominal 120 volts ac input. The other end of capacitor 52 is connected to the anode of zener diode 54 and to the grounded tapped secondary of transformer 48. The output of regulator 58 is connected to the ADC function in device 126 through a decoupling resistor 64 to act as a precise high voltage reference input, as well as being connected to the positive power supply of the ADC function in device 126 and to other circuits 60. Capacitor 65 is connected from this high voltage reference input to circuit ground to complete the decoupling filter. Thus the high voltage reference input to the ADC function in device 126 is isolated from very high frequency voltage variations caused by the operation of device 126 and other circuits 60.

The values of the secondary voltage of transformer 48 and capacitor 52 are chosen so that the positive half-cycle of the voltage supplied by transformer 48 to diode 51 charges capacitor 52 to approximately 15 volts, as limited by zener diode 54. Power supply current for device 126 and other circuits 60 comes from discharging capacitor 52 during the negative half-cycle. This is a sufficient level to maintain the voltage at approximately 7 volts or above, which is the input voltage required by standard 5 volt regulator 58.

Some applications of control 47 will require continued operation for up to one second after loss of 120 volts ac power input. For example, control 47 may need to operate for the time between removing power from a circuit to eliminate a fault and restoration of power by an automatic recloser. In this case, the power can be supplied to device 126 and other circuits 60 by increasing the capacity of capacitor 52 by a factor of approximately 120, so that it will supply current for one second rather than one-half-cycle as in the circuit described above.

The use of the power supply circuitry 110 shown in FIG. 6 fed by one secondary polarity of transformer 48 (the alternate half-cycle), with the sensing input of the ADC function in device 126 fed by the other secondary polarity (the sensed half-cycle), achieves four advantages over prior art. One is that both the device 126 positive power supply voltage and sensing inputs are of positive polarity, as required. The second advantage is that the load currents of power supply 110 taken on one-half-cycle do not interfere with the sensed voltage on the other half-cycle, as might be caused by the common source impedance of potential device 14 or transformer 48. Third, the correct sizing of capacitor 52 would allow control 47 to continue operation for up to one second after removal of 120 volts ac input from potential device 14. Fourth, the inventive power supply 110 provides a savings in the number of components, as well as their cost, required by the power supply circuitry of prior art.

Note that in applications of control 47 where the required response is only to changes in voltage conditions, the voltage input circuit shown in FIG. 6 could be used without a current input. Similarly, the current input circuits shown in FIG. 6 could be used without a voltage signal input if a separate power supply was provided for control 47.

It should be understood that more than one voltage signal can be simultaneously input to the ADC function of device 126; for example, where the function of control 47 requires that three-phase voltage unbalance be calculated. In this case, each of the three voltage signals would be input into separate sensing inputs of the ADC function of device 126, such to those shown in FIG. 6. Similarly, for determining three-phase current unbalance, up to three current signals can be simultaneously input into the ADC function of device 126 by duplicating the circuitry to the signal input, such as those shown in FIG. 6. In a further example, if three-phase watts and vars are required by control 47, three voltages and three currents could be input to the ADC function of device 126, as described above.

Because of the slowly varying nature of signals used for electric power control purposes, the microprocessor in device 126 can sequentially compute the necessary magnitude and relative phase angle quantities, as will be described hereinlater. The number of inputs to control 47 would only be limited by which model of the Motorola M68HC11 family is chosen to be used in the design; either four or eight, according to specifications of the manufacturer.

By using the circuits depicted in FIG. 6, the entire range of the ADC function in device 126, from the low voltage reference input to the 5 volt high voltage reference input, is filled with one-half-cycle of each input signal. Zero now becomes the reference, rather than 2.5 volts dc as in prior art control 17, since the signal through resistor 124 contains only the positive-going wave, thereby filling the entire zero to 5 volt range of ADC 37 with only one-half-cycle, eliminating the need for separate 2.5 volts dc bias circuitry of FIG. 2. Thus one bit of resolution is gained by using the preferred embodiment, which results in a two to one increase in resolution over the prior art of the sampling input method.

Some applications will require a negative power supply, such as −5 volts dc; for example, when using certain wide-temperature-range liquid crystal displays. This can be economically obtained by the power supply circuitry to the −5 volts supply 76, also as shown in FIG. 6. The circuit consists of zener diodes 72 and 75, resistor 74 and capacitor 73. The output of the bottom of the secondary of transformer 48 is connected to the cathode of zener diode 72, the anode of which is connected to the junction formed by the positive end of capacitor 73 and one end of resistor 74. The other end of resistor 74 is connected to the anode of zener diode 75 and to the −5 volts supply 76. The cathode of zener diode 75 is connected to the negative end of capacitor 73 and to the tapped secondary of transformer 48.

The current taken through zener diode 72 for the negative power supply occurs during the alternate half-cycle. Therefore, the distortion that this alternate current might cause by the action of the common source impedance of potential device 14 or transformer 48 does not interfere with the voltage obtained from the sensed half-cycle.

Figure 7:
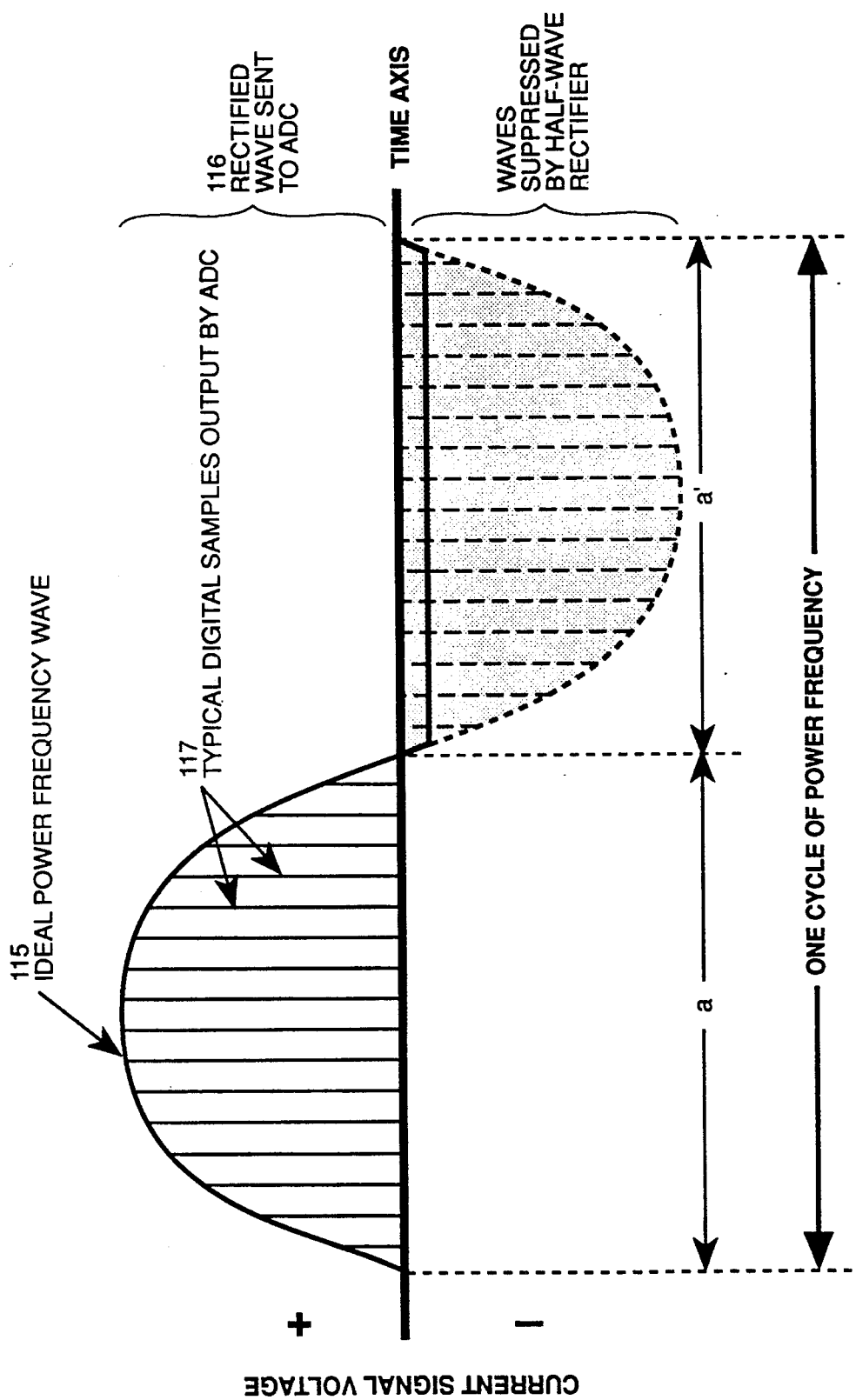
FIG. 7 is a graphical representation of an ideal power frequency current waveform depicting the waves suppressed by the inventive circuit.
Figure 8:
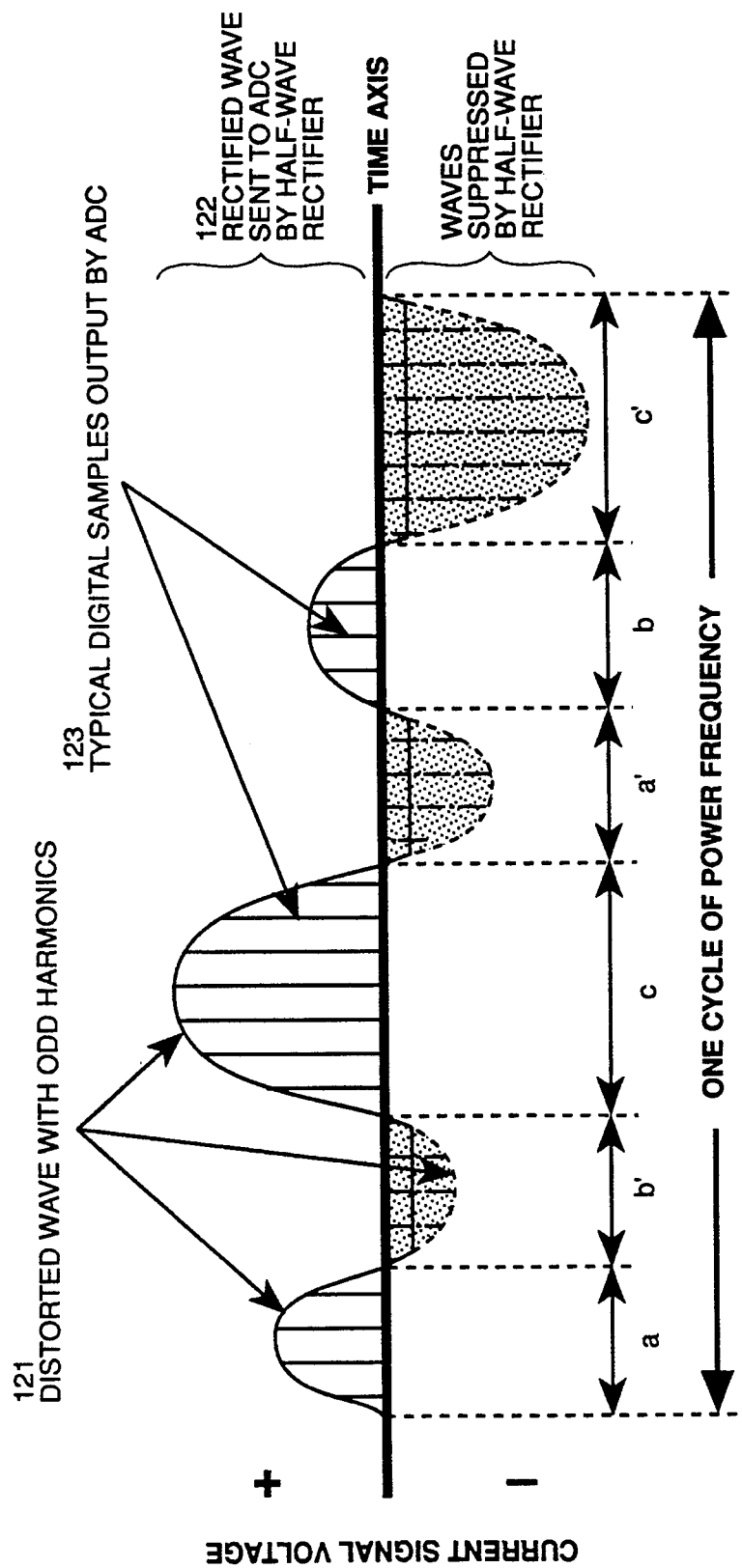
FIG. 8 is a graphical representation of a typical badly distorted current waveform with only odd harmonics depicting the waves suppressed by the inventive circuit.

Referring now to FIGS. 7 and 8, it is seen that the positive or negative portion of the waveshape contains all the information necessary for functions of control 47. An ideal sine wave of power frequency 115 is shown in FIG. 7 as a solid line curve for the positive and a dotted line curve for the negative portion, whereby the negative portion is the displaced mirror image of the positive portion. Since the displacement of the negative portion of the wave is only one-half-cycle duration, it can be assumed that the magnitudes of the measurements required for application of the control 47 have not changed substantially during this time. As shown in FIG. 7, the solid-lined curve above the time axis depicts the rectified wave 116 as it is sent to the ADC in device 126. The vertical lines within the positive portion of the rectified wave 116 depict typical digital samples 117 output by the ADC function to the microprocessor function in device 126. The shaded negative portion of the dotted line wave below the time axis is the portion of the wave suppressed by the half-wave rectifying action of the novel use of device 126 and the accompanying sampling and computational method described hereinlater, which gives zero output when sampled. The horizontal line in the negative portion of the wave depicts the drop in voltage of −0.7 volts across the diode incorporated in device 126. Note that the samples in section "a'" are sampled as zero but are equal in absolute value of magnitude to the samples in section "a." Therefore, all of the information required to perform the functions described previously for control 47 is contained in the positive portion of the wave shown in FIG. 7.

In all but fault or other severe transient conditions, it is the fundamental nature of power system voltages and currents to have only odd harmonics present. Most machines connected to an electric power system (generators and motors) produce symmetrical positive and negative half cycles with only odd harmonics; the even harmonics are suppressed. Thus the positive or negative portions of any voltage or current signal are mirror images of each other about the time axis. Therefore, even with distorted waveshapes, either such portion of a signal can be used alone without losing information. This can be seen by reference to FIG. 8, which shows a severely distorted wave 121 with only odd harmonics, whereby the negative portion is the displaced mirror image of the positive portion, as in FIG. 7. As with the ideal waveform of FIG. 7, the displacement shown in FIG. 8 is only one-half-cycle duration, and it therefore can be assumed that the magnitudes have not changed substantially during this time. In FIG. 8, the solid-lined curves above the time axis depict the rectified wave 122 as it is sent to ADC 37. The vertical lines within the positive portions of the rectified wave 122 depict typical digital samples output by the ADC function to the microprocessor function in device 126. The shaded negative portions of the wave below the time axis are the waves suppressed by the half-wave rectifying action, described previously, which give zero output when sampled. The horizontal line in the negative portion of the wave depicts the drop in voltage of −0.7 volts across the diode incorporated in device 126. Note that the samples in sections "a'," "b'" and "c'" are sampled as zero, but the true values are known to be equal to the samples in sections "a," "b" and "c," respectively.

The relatively slowly changing nature of voltage and current signals used for control of power system apparatus permits the microprocessor function in device 126 to sequentially compute each magnitude and phase angle quantity, as well as frequency, when needed.

Figure 9:
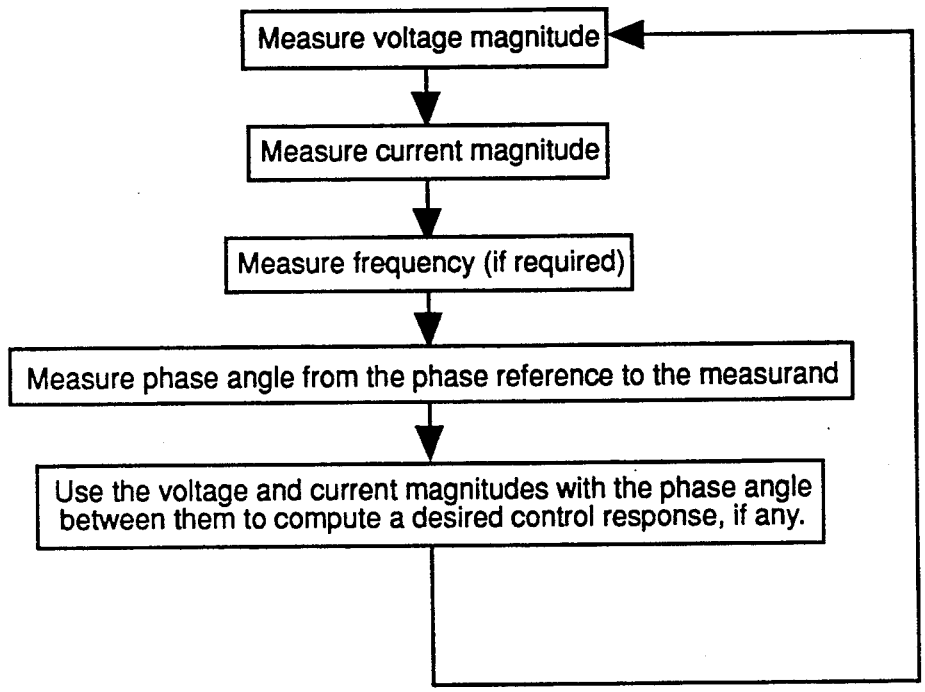
FIG. 9 is a summarizing flow diagram of the inventive method of sampling and computation of the digitized samples by the microprocessor.

The basic structure of an inventive sampling and computational method in the microprocessor function of device 126 in control 47 with one voltage and one current signal input could be as follows, and as shown in FIG. 9:

1. Measure the voltage magnitude.
2. Measure the current magnitude.
3. Measure the frequency (if required).
4. Measure the phase angle from one voltage as a reference to each current or additional voltage input.
5. Calculate the necessary quantities from the input data, update timers, calculate control criteria, and initiate control action, if necessary.
6. Repeat steps 1 through 5.

For the purposes of the following discussion, the term, "non-zero" will refer to any sample whose magnitude is greater than zero. Since the half-wave rectifying action of the circuitry, and sampling and computational method described herein, give a zero value to that portion of the wave that is negative, there is a transition point where the samples go from some value of magnitude to zero. This will be termed, "the non-zero to zero transition." The opposite transition also occurs, and will be defined as, "the zero to non-zero transition." Note that in the following sampling and computational method, it is necessary to compute the square root of the area of the square of the signal in order to obtain the rms value of a signal. The square of each sample must be multiplied by the time differential from one sample to the next, thus forming the desired area under the square of the signal. This time differential is the same between any two samples, and so can be factored out and multiplied once by the sum of the squares when a non-zero to zero transition occurs. Moreover, this differential in time is the reciprocal of the number of counts, and so the final sum of squares can be divided by the count of the number of non-zero samples, effectively forming an average of the square of the samples. The square root can then be taken of this average. As a mathematical formula, this would be:

$$S_1^2 * 1/n + S_2^2 * 1/n + \ldots$$

which reduces to $(S_1^2 + S_2^2 + \ldots)1/n$ where:

S = non-zero sample, and
n = number of non-zero samples in a single positive half-wave.

For example, referring to the waveform shown in FIG. 7, the number of digital samples 117 is 16, so n=16.

In detail, using a voltage input as an example, the inventive method uses the following steps in device 126, as shown in FIGS. 10(*a*) and 10(*b*).

1. Read the samples of the voltage signal.
2. Start a sum of the non-zero sample magnitudes squared when the first zero to non-zero transition of the voltage signal occurs, and start a count of the non-zero samples, using a programmed counter.
3. Continue to sum and count successive non-zero samples until another zero sample of the voltage signal occurs.
4. Divide the resultant sum of the non-zero squared samples by the number of non-zero samples counted by the programmed counter.
5. Reset the programmed counter.
6. Compute the square root of the result from step 4, thereby converting the result of step 4 to equivalent alternating current volts.
7. Repeat steps 1 through 6 for samples of the current signal to obtain alternating current amperes.
8. If frequency is required for applications of control 47, complete steps 9 through 11. If frequency is not required, go to step 13.
9. Read the samples of the voltage signal, and start the on-board counter (time counter) when a zero to non-zero transition occurs.
10. Stop the on-board counter when a non-zero to zero sample occurs.
11. Divide a constant (see below) by the count on the on-board counter to obtain frequency in cycles per second. Store the result for use in step 19, if required. For example, assume that the frequency is 60 Hz, then the period would be 16,666 microseconds (that is, 1/60). If the on-board counter operates at 1 MHz, then the count would be 16,666 microseconds. For example:

$$
\begin{aligned}
\text{Constant} &= (\text{Frequency})(\text{Count}) \\
&= (60)(16,666) \\
&= 10^6
\end{aligned}
$$

12. Reset the on-board counter.
13. Read the samples of a phase reference signal, and start the on-board counter when a zero to non-zero transition occurs.
14. Read the samples of a measurand, and stop the on-board counter when a zero to non-zero sample transition occurs.
15. Read the samples of the phase reference signal, and start the on-board counter of the microprocessor when the next non-zero to zero transition occurs.
16. Read the samples of the phase measurand signal, and stop the on-board counter when the next non-zero sample transition occurs.
17. Multiply the resultant count from step 16 by a constant, such that the angle in degrees from the reference to the measurand is obtained. For example, assuming that the frequency is 60 Hz, then the period would be 16,666 microseconds (that is, 1/60). If the on-board counter operates at 1 MHz, then count would be 33,333 in microseconds for a phase angle of 360 degrees, since the method we use counts the period twice. Therefore:

Phase Angle = (Constant)(Count)

$$\frac{\text{Phase Angle}}{\text{Count}} = \text{Constant}$$

Phase Angle = 360(in degrees)
Count = 33,333(in microseconds)

-continued $$\text{Constant} = \frac{360}{33,333}$$

$$= 0.0108 \text{ degrees per microsecond.}$$

The angle in degrees can be converted into radians by known formulas, as required.

18. Reset the on-board counter.

19. If applications of control 47 anticipate frequencies other than 60 Hz, correct the phase angle for frequency deviation from 60 Hz, using the result from step 11. This is done by multiplying the phase angle obtained from step 17 by f/60, where f is the actual frequency obtained from step 11.

20. Use the voltage, current and phase angle magnitudes in computations to determine if a response is required of control 47.

Since a minimum of computations is required when the samples are taken by the microprocessor function in device 126 using the above programming method, the samples can be taken quite rapidly. Thus the sampling rate can be set by the program in the microprocessor function in device 126 and not by a program clock, as in prior art methods. The large number of samples per cycle, therefore, places the anti-aliasing cut-off frequency sufficiently high so that anti-aliasing filters are unnecessary.

The large number of samples that can be taken by the above programming method could stress the memory capacity, if storage of sample magnitudes or results of computations was required. However, the inventive program makes storage of individual samples unnecessary. In addition, the large number of samples gives a fine resolution of time in the transition of samples from zero to non-zero values and vice-versa. This leads to a fine resolution of frequency or phase measurement in the programming method. The accuracy of the frequency determination is limited only by the resolution of the on-board counter and the accuracy of the clock frequency of the microprocessor function in device 126. The accuracy of phase measurements based on zero-crossing information is adversely affected by harmonic distortion of the signals. However, power voltage signals seldom have more than about 2% harmonic distortion. Moreover, using the circuits of FIG. 6, as previously described; or those of FIGS. 14(b) and 14(d), which will be described hereinlater, the current distortion will also be quite low. For many applications, therefore, these programming methods will be adequate and will give the advantage of using less memory in device 126 than more sophisticated computational methods, which often require additional external memory. This savings in memory is especially important when using microprocessors with on-board memory, since it eliminates the need for external memory.

Note that there are other analytical methods that will yield an accurate phase angle in spite of harmonics, and these may be used when the application of control 47 requires this greater accuracy.

The programming method described above adds the count of zero to non-zero transitions to the count of non-zero to zero transitions by continuing the counter during both the first and second measurements, and averaging the two counts for conversion to phase angle. The division by two is combined into the constants that are required to convert the count to phase angle, either in degrees or radians, as required. Thus the sampling and computational method reduces phase angle errors that could be caused by even harmonics. This can be seen by reference to FIG. 11, which shows two rectified waves with arbitrary time increments shown on the horizontal time axis. The top wave in this figure is slightly distorted, since the positive pulse is 9 increments in length, and the suppressed portion is 11 increments. The bottom wave is undistorted, with each portion equal to 10 increments. One method could compare the time difference between when the zero to non-zero transition occurs (hereinafter referred to as the leading edge) on the bottom wave to when the zero to non-zero transition occurs (hereinafter referred to as the trailing edge) on the top wave, with the result being 6 increments, as shown in FIG. 11. Another method could compare the time difference between when the non-zero to zero transition occurs on the bottom wave to when the non-zero to zero transition occurs on the top wave, with the result being 5 increments, as shown in this figure. Neither method is more correct in evaluating the phase difference between the two waves, but the resultant difference between the two methods is one increment. In the preferred embodiment, the method described above uses the average of the leading edge measurement and the trailing edge measurement (5+6=11 divided by 2=5.5) to determine the distance between the centers of the two waves, which is a better estimate of the phase angle between the two waves. Even though the actual time differences may be quite small, using the distance between the centers of the two waves in calculations is an improvement in accuracy over using either the leading or trailing edge measurement of the wave.

The determination of phase angle when a current signal is at a very low amplitude, as may occur when the electrical power circuit is lightly loaded, can present a problem to control devices. The problem and the manner in which the preferred embodiment and inventive sampling and computational method solve the problem is best understood by reference to FIG. 12. Here it is necessary to look more closely at the performance of ADC 37 in microprocessor 126.

Figure 12:
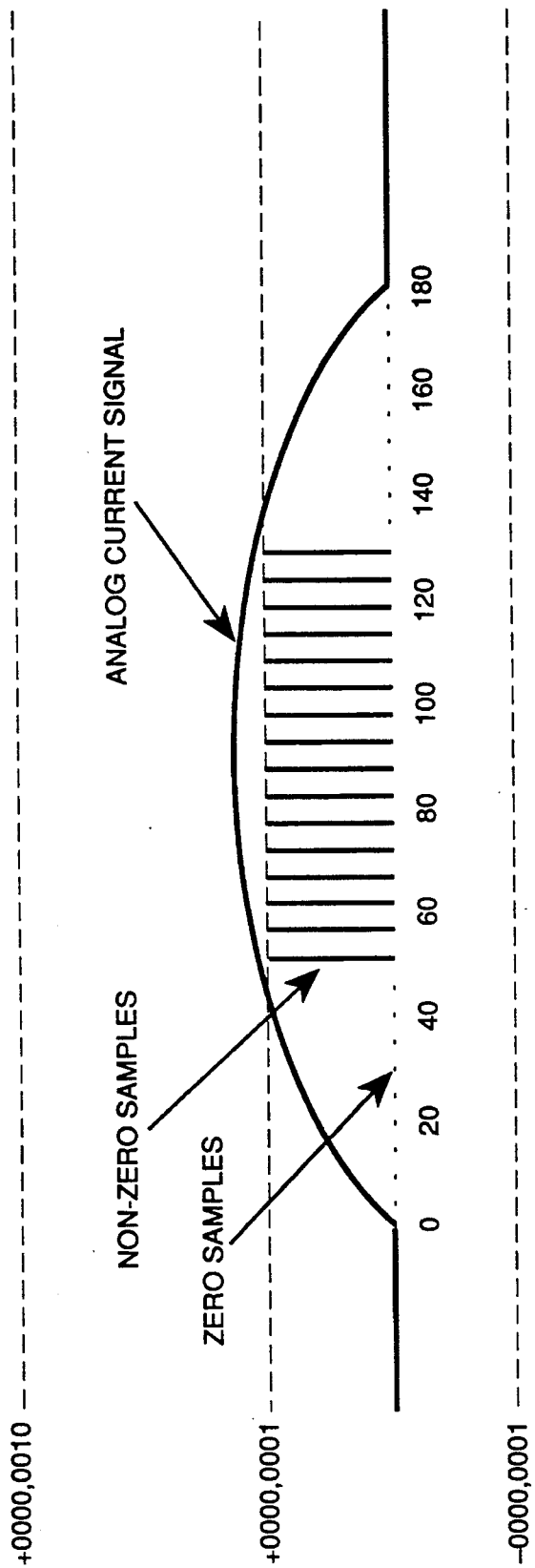
FIG. 12 is a graphical representation depicting how the inventive circuitry and method cancels potential phase angle errors that would be due to an analog current signal of low magnitude, .

A built-in feature of ADC 37 is that the analog input is offset by one-half bit, so that the digital output of +0000,0001 is obtained at the same magnitude of positive analog input voltage as the digital output −0000,0001 would be from a negative voltage, if all negative samples were not suppressed by ADC 37. FIG. 12 shows a very low analog current signal with the first non-zero sample of +0000,0001 starting at 50 degrees and ending at 130 degrees. As can be seen, there would be a positive error of 50 degrees if the on-board counter timed from a zero to non-zero transition. Further, if only the non-zero to zero changes were used in the calculations, the stopping point of the non-zero samples at 130 degrees would cause a negative 50 degree error. In the inventive method described previously, the count is made of both zero to non-zero and non-zero to zero intervals. It can be seen that the errors brought about by low amplitude signals will cancel.

In summary, the sampling and computational method described hereinbefore performs a sampling and summing of the square of the samples at as fast a rate as the microprocessor function of device 126 is capable of with a 2 megahertz clock frequency. This is the maximum rated clock rate of device 126, but is also the rate recommended by the manufacturer of device 126 for best performance of the ADC function of the device.

This sum is then divided by the number of samples taken during one-half wave input of the signal. The square root of this answer is well known to be the rms value of the input signal.

Various other computational methods can be used after reading each sample. For example, a simple sum divided by the number of samples gives the average value of the wave. Alternatively, a discrete Fourier transform could be calculated. The rms computation illustrated, however, has the additional advantage of being correct with a combination of harmonic distortion components, either even or odd multiples of the fundamental.

The use of a very large number of samples per half-cycle as compared with prior art is that the quantization error, which is fundamentally associated with the use of commonly known ADCs, is averaged to give a result of considerably better resolution than the resolution of any single sample. This has been simulated by computer program for an 8-bit ADC of the type used in the preferred embodiment, and described previously. It is found that with 80 samples per half-cycle, the expected error is 0.0115%. The improvement is, therefore, a factor of 8.48, and equivalent to greater than three bits. When added to the one bit improvement through the use of the half-wave rectifier, as described hereinbefore, the total improvement of the preferred embodiment is greater than four bits. In other words, the inventive combination of apparatus and computational method gives an 8-bit ADC, such as that found in the preferred device 126, the accuracy that would require a 12-bit ADC using prior art technology.

Only two components affect the accuracy of voltage measurement in the preferred embodiment. One is transformer 48, and specifically the turns ratio between the primary and the lower half of the secondary of 48. In the preferred embodiment, these transformers are wound using a turns counter with no variation in turns permitted. The voltage signal can thus be calculated from the turns ratio. One can be certain that the turns ratio will not vary with temperature or age of the transformer.

The only other component significantly affecting accuracy is the output voltage of 5 V regulator 58. The preferred form has an initial tolerance of plus or minus 0.2% and a stability of plus or minus 0.022% from minus 40 degrees C to plus 80 degrees C. Calibration of control 47 using this embodiment therefore consists of accurately measuring initial dc voltage and entering it into non-volatile memory of device 126 (i.e., that portion of memory where data will not be lost when input power is removed from control 47). This data can then be used by the microprocessor function in device 126 to correct the scaling factor.

Choice of transformer 48 and 5 V regulator 58, and use of the previously described computational method gives a computed accuracy of voltage amplitude measurement better than plus or minus 0.1%. The state of the art of calibration against an ac input voltage does not permit calibration to 0.1%, therefore the inventive computational method described hereinbefore is used in the preferred embodiment.

The use of a faster sampling rate afforded by use of device 126 also makes anti-aliasing filters, such as those that will be described hereinlater in FIGS. 13 and 14, unnecessary. For example, the highest significant harmonic expected on an electric power system is the 13th, and a sampling rate of 13 per half-cycle or greater allow anti-aliasing filters to be eliminated. A sampling rate of 80 per half-cycle is therefore preferred, both since it is far above that required to eliminate the filters and also because it is the rate established by the design of the microprocessor in device 126 running at its preferred clock rate.

Since the ADC function and diode protection in device 126 are sufficient to perform the tasks required for half-wave rectification, additional circuitry; such as half-wave rectifier HWR 40 and 41, shown in FIGS. 13 and 14 and described hereinafter; are not necessary in the preferred embodiment. The circuitry of FIGS. 13 and 14 will be described, however, to illustrate how a half-wave rectifier function could be designed using an ADC and microprocessor of a design other than that shown for the preferred embodiment.

It should be noted that any of the voltage input circuits shown in FIG. 13 can be combined with the current inputs shown in FIG. 14 to perform the functions described hereinafter. All of the voltage input circuits in FIG. 13 could be used without a current input in control 47 whose application only required it to respond to changes in voltage conditions. Similarly, all of the current input circuits shown in FIG. 14 could be used without a voltage signal input if a separate power supply was provided for control 47.

Refer now to FIG. 13, which shows two detailed voltage input circuits to ADC 37 using a half-wave rectifier circuit 40. The ADC 37 shown in this figure may be of various standard designs, either with a sample-and-hold circuit built-in, or one that requires external sample-and-hold circuits for each input signal. It will be assumed that ADC 37 has an 8-bit resolution, although the inventive circuits described hereinlater could easily be applied to ADCs with different resolution capabilities, while still providing the number of bits improvement of said circuits stated herein.

Figure 13A:
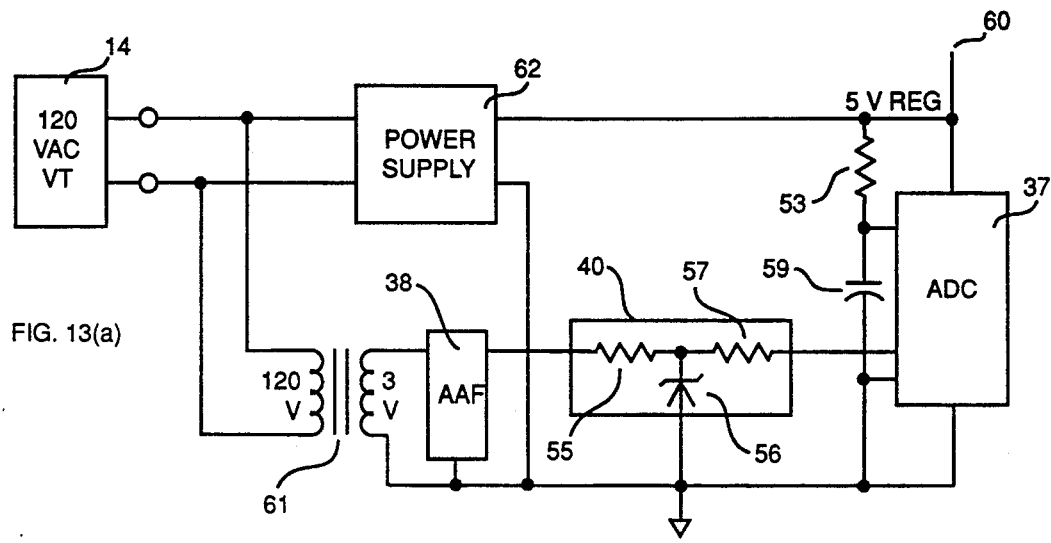
FIGS. 13(a) and 13(b) are schematic diagrams depicting alternate circuitry to input voltage information into an analog-to-digital converter.

As in the preferred embodiment described previously, the input to circuits shown in FIG. 13 would be from potential device 14, also as described previously. As shown in FIG. 13(a), the output of potential device 14 is connected both as the input to a 5 volt dc power supply 62 for the positive power supply input of ADC 37 and other circuits 60, as required; and to the primary of transformer 61. Transformer 61 is scaled so as to produce a maximum peak voltage of 5 volts into ADC 37. Resistor 53 and capacitor 59 form a filtered 5 volt dc high voltage reference for ADC 37. One side of resistor 53 is connected to the positive power input of ADC 37, the other side is connected to the junction of the positive end of capacitor 59 and the high voltage reference input to ADC 37. The negative end of capacitor 59 is connected to circuit ground to complete the filter.

The input to AAF 38, of well known design described previously, is from one terminal of the secondary of transformer 61. The output of the AAF 38 is connected to the half-wave rectifier circuit (HWR) 40, which is formed by resistor 55, zener diode 56 and resistor 57. Resistors 55 and 57 are connected in series from the output of the AAF 38 to the sensing input of ADC 37. The cathode of zener diode 56 is connected to the junction of resistors 55 and 57.

The other terminal of the secondary of transformer 61, the common terminal of AAF 38, the negative output of power supply 62, the anode of zener diode 56, and the low voltage reference and negative power inputs of ADC 37 are interconnected to form a common circuit ground.

Resistor 55 in combination with zener diode 56 holds the negative half of the wave from going negative by more than the forward drop across the zener diode 56, thereby protecting ADC 37 from potentially damaging negative inputs. The forward voltage rating of zener diode 56 is chosen so that, with tolerance, it is more than the 5 volt high voltage reference input to ADC 37, formed by resistor 53 and capacitor 59. Resistor 57 limits the current into the ADC to allowable limits considering the worst possible excursion of the voltage signal out of range as first limited by zener diode 56.

Zener diode 56 must be of the type that conducts as a normal diode with the anode negative, and not the type that has another diode junction serially in the opposite direction for temperature compensation. In this way, the negative portion of an input signal is limited by resistor 55 to the forward drop of about 0.6 volts across diode 56. Note also that this forward diode drop voltage across diode 56 will be expected to vary with temperature, as is characteristic of all diodes. Thus the negative portion of the input signals may vary from perhaps negative 0.5 volts to negative 0.75 volts, but this variation in no way effects the digitizing accuracy. Resistor 57 limits the current into the sensing input of ADC 37 to safe levels during the negative portion of any input signal.

Most commonly available analog-to-digital converters, such as ADC 37, have internal protection on the analog inputs against excessive voltages so long as the current is limited to a rating given for the device. Therefore, a sufficiently high value of resistor 57 could limit the signal input to safe levels without the forward conduction of diode 56. However, this higher value required of resistor 57 might cause errors as a result of the interaction of resistor 57 and the input impedance of ADC 37. Therefore, adding diode 56 to HWR 40 eliminates the possibility of errors due to this interaction, as well as protects ADC 37. The protective diode in ADC 37 thus only needs to protect against very high frequency voltages; a task that only it can perform due to its close proximity to the analog-to-digital converter circuitry in ADC 37.

Note further that a diode could be serially-connected in place of resistor 55 with a resistor replacing diode 56. This configuration would operate properly over a narrow temperature range by conducting the positive portion of the signal to ADC 37. However, the variation due to temperature of the forward drop through this diode would introduce considerable error at temperatures outside a narrow range, and is, therefore, not preferred.

Figure 1:
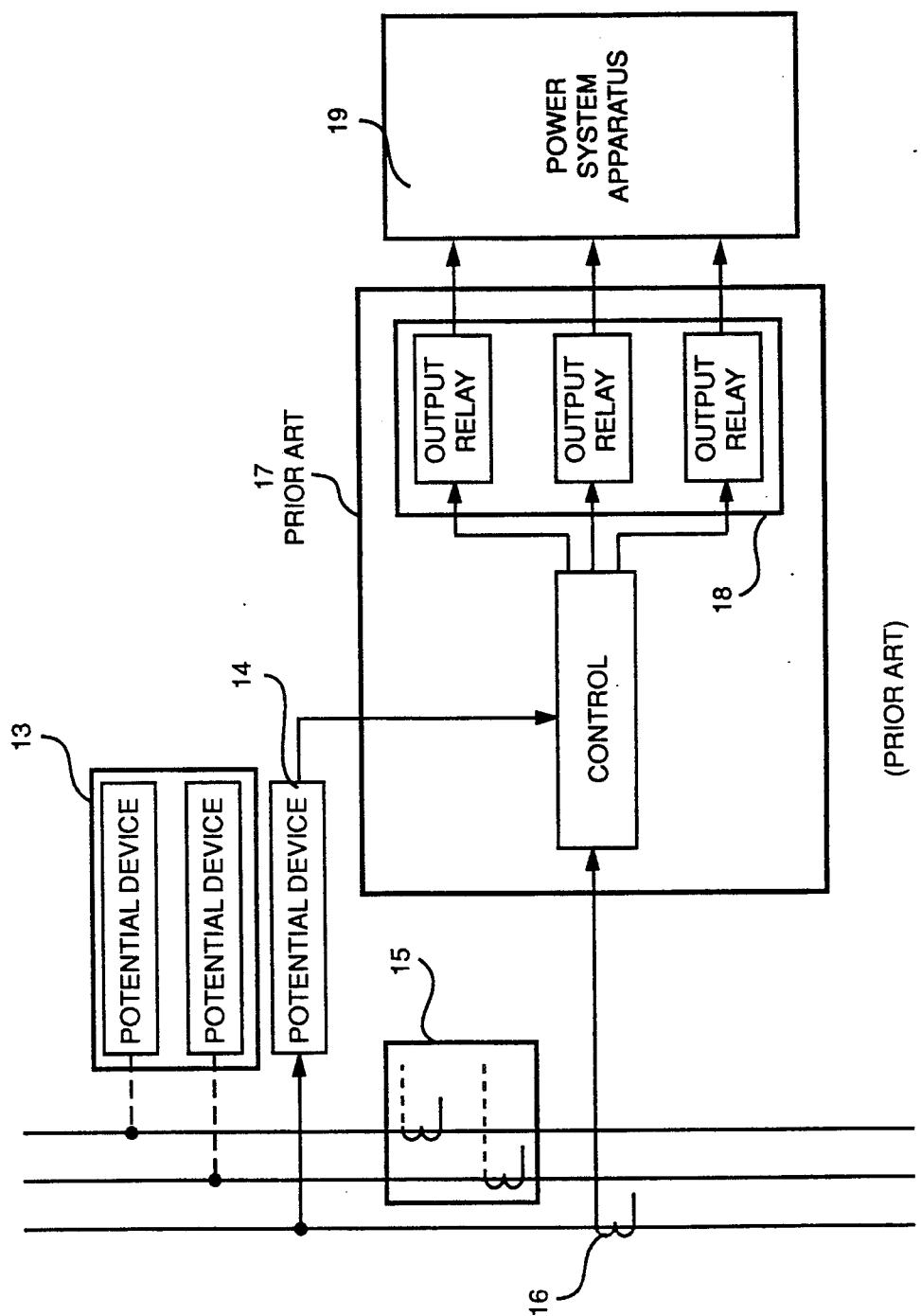
FIG. 1 is a block diagram showing the basic application of prior art controls.
Figure 2:
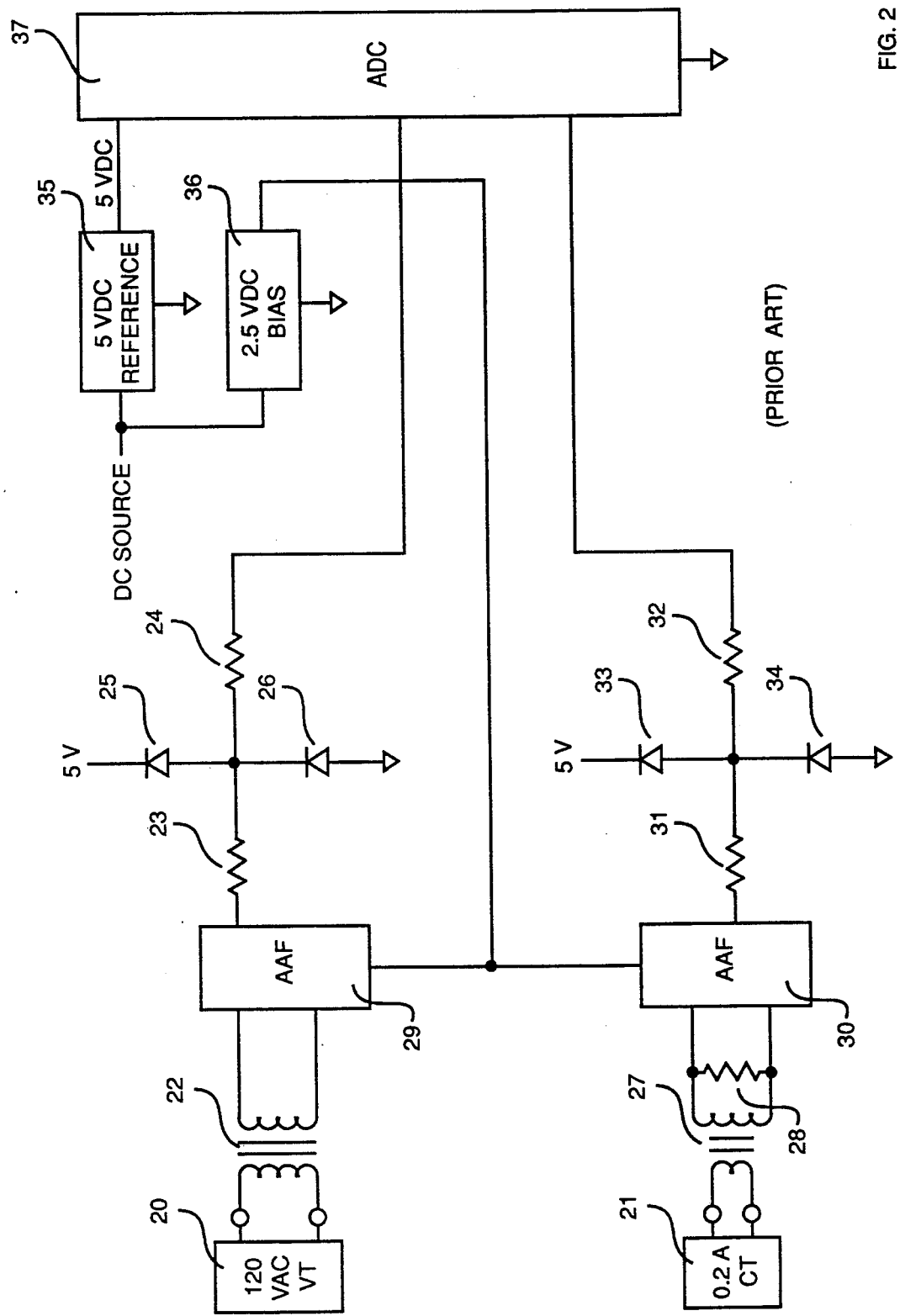
FIG. 2 is a schematic diagram depicting prior art bipolar voltage and current input to an analog-to-digital converter.

With HWR 40, zero now becomes the reference, rather than 2.5 volts dc as in prior art control 17, since the signal from HWR 40 contains only the positive-going wave, thereby filling the entire zero to 5 volt range of ADC 37 with only one-half of the wave, eliminating the need for separate 2.5 volts dc bias circuitry of FIG. 2.

Figure 13B:
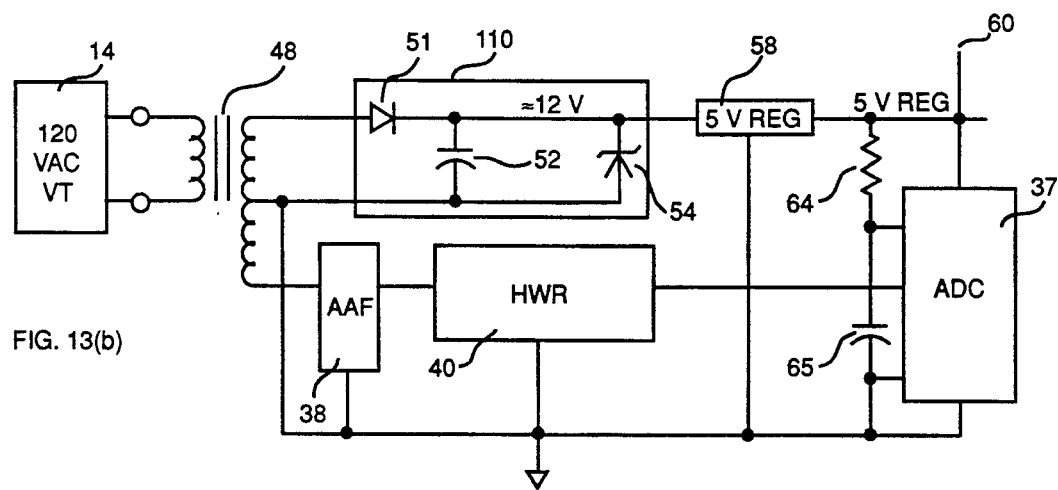

Refer now to FIG. 13(b), which shows a variation of the voltage input circuit to ADC 37 shown in FIG. 13(a). The input circuit to ADC 37 in FIG. 13(b) is the same as that shown for the voltage input portion of the preferred embodiment, described previously and shown in FIG. 6, with one exception: resistor 124 is replaced by AAF 38 and HWR 40. The bottom terminal of the secondary of transformer 48 provides the positive half cycles through AAF 38 and HWR 40, described previously, to the signal input of ADC 37.

Figure 14A:
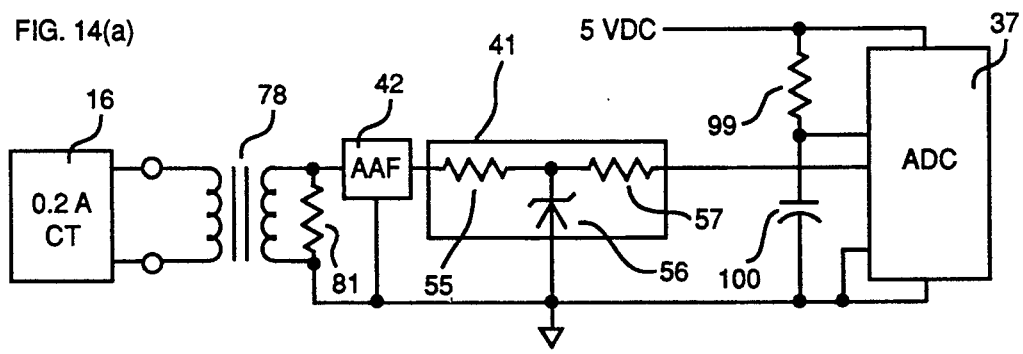
FIGS. 14(a), 14(b), 14(c) and 14(d) are schematic diagrams depicting alternate circuitry to input current information into an analog-to-digital converter.
Figure 14B:
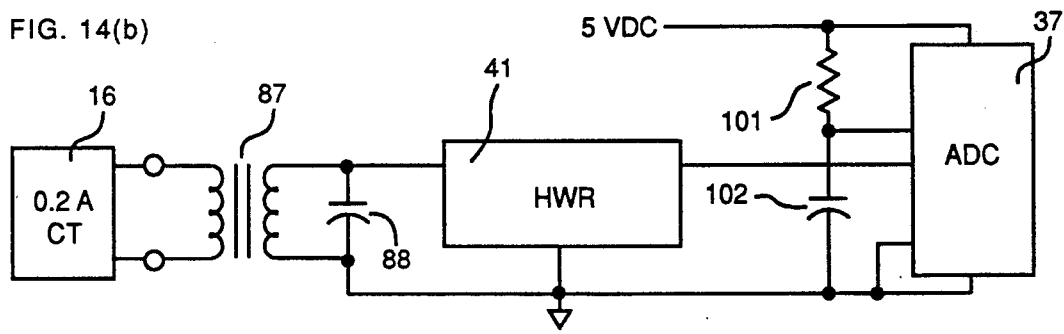
Figure 14C:
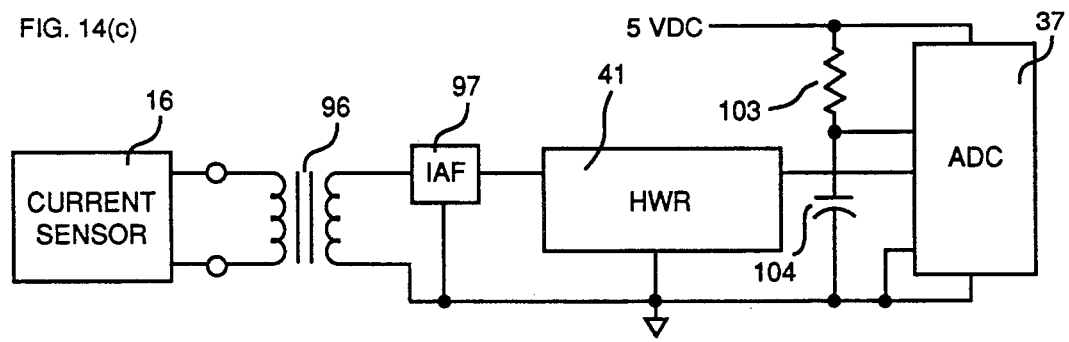
Figure 14D:
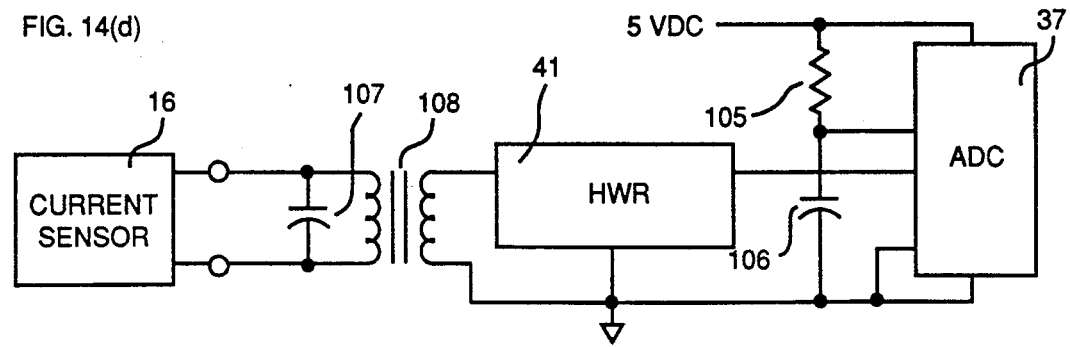

Refer now to FIGS. 14(a), 14(b), 14(c) and 14(d), which show circuitry to bring the current input to ADC 37 using the half-wave rectifier 41. FIGS. 14(a) and 14(b) depict the circuitry required if the current sensing device 16 is a 0.2 amp current transformer, and FIGS. 14(c) and 14(d) depict the circuitry required for a line current sensor, both as described hereinbefore. In these schematics, the power supply to the positive power input of ADC 37 would be 5 volts dc from the power supplies shown in FIG. 13(a) or 13(b), described previously, or from some other voltage source, as required. The decoupling networks formed by resistor 99 and capacitor 100, resistor 101 and capacitor 102, resistor 103 and capacitor 104, and resistor 105 and capacitor 106 would also be required in the current input circuits to ADC 37; and would perform the same functions as described previously for the voltage input circuits.

Refer now to FIG. 14(a). The current signal is obtained from the secondary of current transformer 16, as described previously, and is connected to the input of ACT 78. Burden resistor 81, scaled to give a peak voltage of 5 volts, is connected across the output winding of ACT 78. The junction of one terminal (top for purposes of this illustration) of 78 secondary and one end resistor 81 is connected to the input of AAF 42, as described previously. The output of AAF 42 is connected to the input of HWR 41. The components in HWR 41 are the same as previously depicted for the HWR 40 in FIG. 13(a), except resistor 55 and resistor 57 are connected in series from the output of AAF 42 to the signal input of ADC 37. The circuit ground connection for this circuit is formed by the junction of the bottom terminal of ACT 78 secondary, the bottom of resistor 81, the anode of zener diode 56, the negative side of capacitor 100, and the low voltage reference and negative power inputs to ADC 37.

The HWR 41 functions in a manner similar to HWR 40, limiting the negative portion of the wave, but it differs from that of HWR 40 in that harmonics on the current signal are not suppressed up to the previously defined AAF cut-off frequency. Therefore, the circuit shown in FIG. 14(a) would not be adequate for control applications on electric power systems with very non-linear loads, such as arc furnaces, since the current waveshape may be quite distorted. Since most controls, such as control 47, should respond to the fundamental component of the current signal, a variation of the circuit of FIG. 14(a) that addresses this limitation is shown in FIG. 14(b).

Refer to FIG. 14(b), which shows an alternative current input circuit similar to FIG. 14(a), but with the substitution of capacitor 88, connected across the terminals of ACT 87, as the burden, in place of resistor 81 of FIG. 14(a). Therefore, the circuit shown in FIG. 14(b) is the same as that shown in the current input portion of FIG. 6, with one exception: resistor 125 in FIG. 6 is replaced by HWR 41 in FIG. 14(b). The junction of the top terminal of ACT 87 and the positive end of capacitor 88 is connected to the input to HWR 41, whose output is connected to the sensing input of ADC 37. The ground connection for the circuit shown in FIG. 14(b) is the same as that shown in FIG. 14(a), except that the negative side of capacitor 88 is connected to ground instead of resistor 81.

The inventive use of capacitor 88 in the circuit shown in FIG. 14(b) provides the same advantages as when it is used in the preferred embodiment, as described previously.

Refer now to FIGS. 14(c) and 14(d), which show two circuits for using the inventive HWR 41 to input information from a current sensor as the current sensing device 16 into ADC 37.

One disadvantage of a current sensor as a current sensing device 16 is that the voltage output to auxiliary current transformer (ACT) 96 is the differential of the electric power current. Thus the integrating and anti-aliasing filter (IAF) 97 connected serially from one terminal of ACT 96 to the input of HWR 41 must both overcome the 6 decibel per octave increase in harmonics produced by the differentiation effect, but also must produce the additional attenuation normally required to overcome the aliasing effect. The IAF 97 is therefore more complex than the anti-aliasing filters depicted hereinbefore, since it forms a differentiating or low-pass circuit and also compensates for the integrating effect of the current sensor. The rest of the circuit depicted in FIG. 14(c) is similar to those in FIGS. 14(a) and 14(b), except that the other terminal of ACT 96 is tied directly to ground at the junction formed by HWR 41, capacitor 104, and the low voltage reference and negative power inputs of ADC 37.

Refer now to FIG. 14(d), which shows a variation of the circuit shown in FIG. 14(c). In this circuit, capacitor 107 is connected in parallel to the outputs of current sensor 16 for the same reasons and advantages as described previously in the preferred embodiment of FIG. 6. The rest of the circuit depicted in FIG. 14(d) is similar to that of FIG. 14(c), except that the other terminal of ACT 108 is tied directly to ground at the junction formed by HWR 41, capacitor 106, and the low voltage reference and negative power inputs of ADC 37.

Capacitor 107 therefore saves the number and cost of components required to perform the integrating and anti-aliasing function of the IAF 97 of FIG. 14(c). In addition, as in the preferred embodiment, capacitor 107 improves calculations of signal amplitude and phase relationship, increasing the accuracy of control 47.

Thus the inventive circuits shown in FIGS. 13 and 14 provide $2^8$ or 8-bit resolution for one-half of the wave, which results in a two to one improvement in accuracy over the prior art full-wave method of FIG. 2.

Figure 10A:
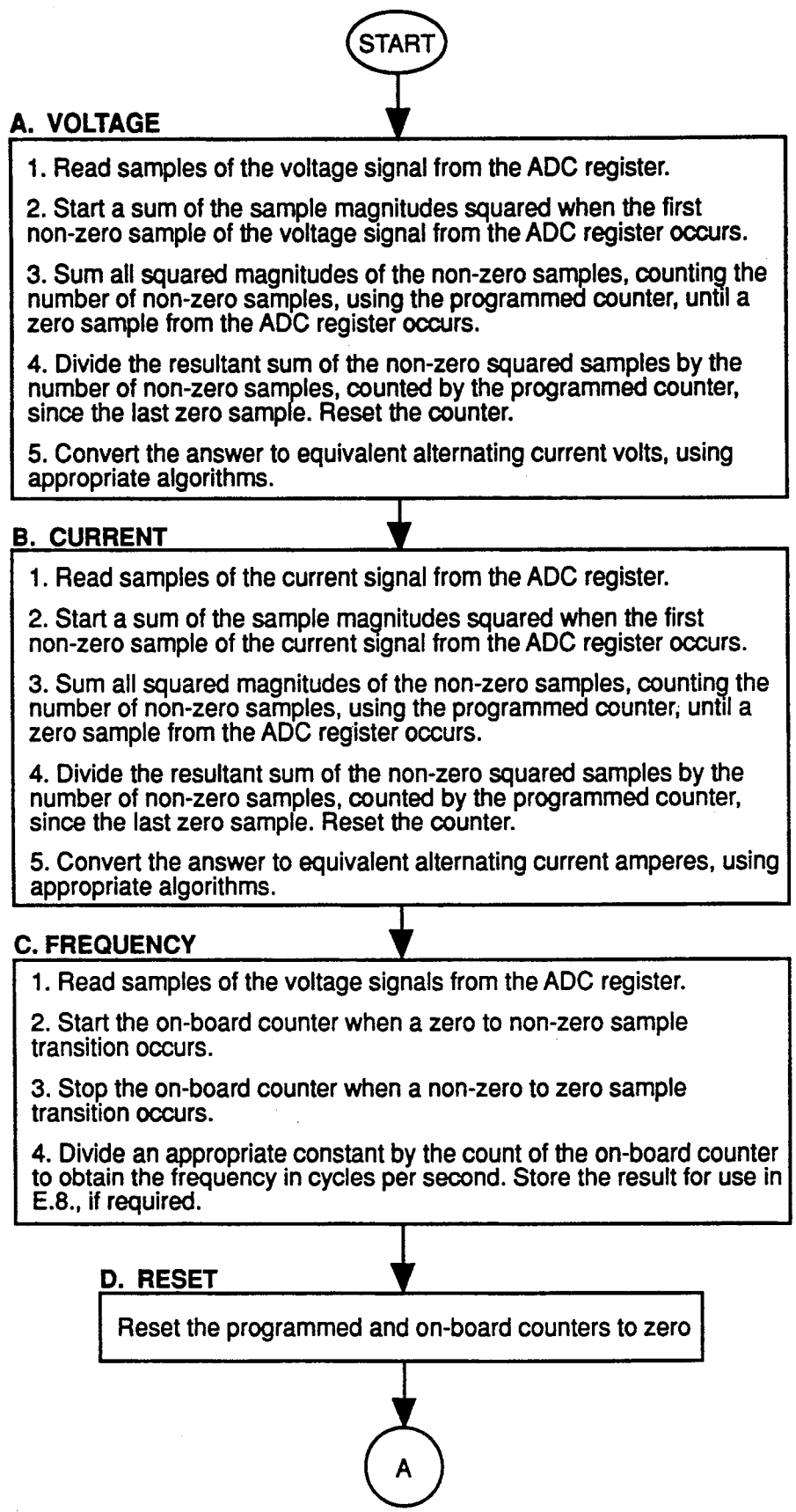
FIGS. 10(a) and 10(b) are detailed flow diagrams of the inventive method of sampling and computation of the digitized samples by the microprocessor.
Figure 10B:
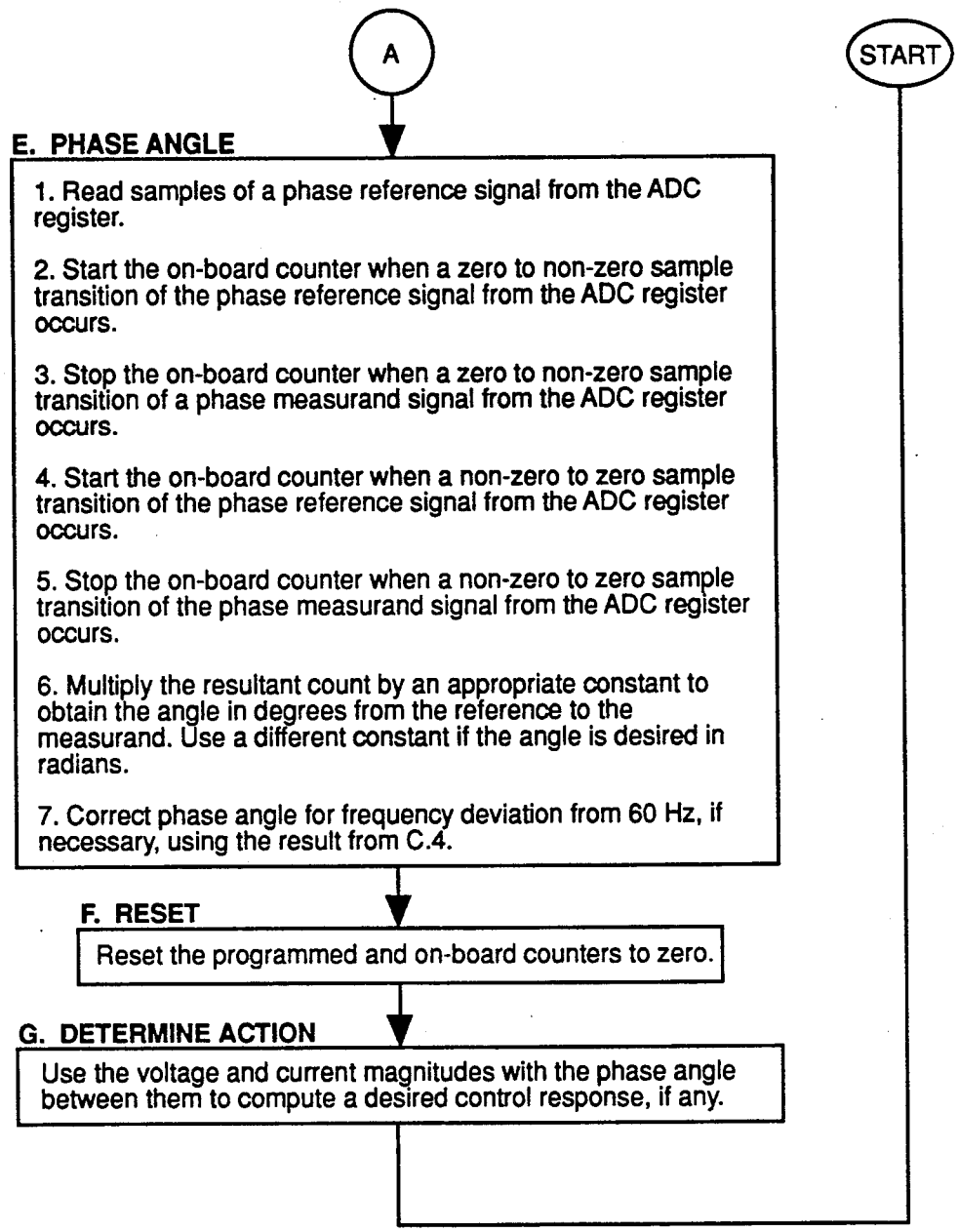

The combination of circuitry shown in FIG. 6 and method shown in FIGS. 9, 10(a) and 10(b) has the advantage of a reduction in parts over the prior art method, therefore improving the reliability and reducing the cost, while at the same time obtaining as much as a sixteen-to-one improvement in accuracy of voltage and current magnitude measurement over prior art.

While the invention has been particularly shown and described with reference to a preferred embodiment thereof, it will be understood by those skilled in the art that various changes in form and details may be made therein without departing from the spirit and scope of the invention.

What is claimed is:

1. Apparatus for receiving and digitizing alternating current (AC) signals of the same frequency and for determining the phase angle between two received signals, each signal coming from a pair of terminals with the potential of one terminal being the ground reference for said signal and with the signal potential of the second terminal alternating about said reference potential, comprising in combination,
    a) analog-to-digital converter means (ADC) having at least two analog inputs, having a low and a high reference input and having a range of operation starting with zero for an analog input equal to said low reference input voltage,
    b) a high ADC reference voltage connected to said high reference input,
    c) at least two of said second signal terminals being connected to said ADC analog inputs,
    d) said ADC having said low reference input connected to each said AC signal ground terminal to set the change of signal polarity to said ADC zero,
    e) said ADC providing periodic non-zero digital samples proportional to said AC signals whenever the polarity of said AC signal is the same as said high reference voltage and providing digital samples which are zeros whenever the polarity of said AC signal is not the same as said high reference voltage,
    f) means for receiving and processing said digital samples and sensing transitions in said digital samples from zero to non-zero (znz) and non-zero to zero (nzz),
    g) means for determining the phase angle between any two received AC signals after sensing (1) at least one pair of said znz transitions, the first from a first AC signal and the second sequentially from the second AC signal, and (2) at least one pair of said nzz transitions, the first from said first AC signal and the second sequentially from said second AC signal, and
    h) means for averaging the phase angle result from said first pair of transitions with the results from said second pair of transitions to obtain the phase angle between the centers of the two signals.

2. Apparatus as in claim 1 for determining the phase angle between any two received AC signals when essentially the same number of samples are obtained for each of the two signals, said means for sensing said transitions senses only said znz transitions, the first from a first AC signal and the second sequentially from a second AC signal to determine said phase angle.

3. Apparatus as in claim 1 for determining the phase angle between any two received AC signals when essentially the same number of samples are obtained for each of the two signals, said means for sensing said transitions senses only said nzz transitions, the first from a first AC signal and the second sequentially from a second AC signal to determine said phase angle.

4. Apparatus as in claim 1 further including:
    a) processor means,
    b) means for entering data into said processor,
    c) means for measuring said high ADC reference voltage and entering said measurement into said processor means,
    d) means for providing a scaling factor for said AC signals, and
    e) said processor means determining a correction to said scaling factor depending on said measurement.

5. Apparatus for digitizing alternating current (AC) signals of the same frequency, each signal coming from a pair of terminals with the potential of one terminal being the ground reference for said signal and with the signal potential of the second terminal alternating about said reference potential comprising, in combination,
    a) analog-to-digital converter means (ADC) having at least one analog input, having a low and a high reference voltage input and having a range of operation starting with zero for an analog input equal to said low reference input voltage, b) a high ADC reference voltage connected to said high reference input, c) at least one said second signal terminal being connected to said ADC analog inputs resulting in signals on said second terminals having a selected polarity which is the same as the polarity of said ADC high voltage reference, d) said ADC having said low reference input connected to each said AC signal ground terminal to set the change of signal polarity to said ADC zero, e) said ADC providing periodic non-zero digital samples proportional to said AC signals whenever the polarity of said AC signal is the same as said high reference voltage and providing digital samples which are zero whenever said AC signals are not of the selected polarity, and f) means for receiving and processing said non-zero digital samples to make desired measurements to obtain accurate parameters of said entire AC signals.

6. Apparatus for digitizing alternating current (AC) signals of the same electric power system frequency and wherein at least one said signal represents AC current having harmonics and produced by a current transformer with said signal coming from a pair of terminals with the potential of one terminal being the ground reference for said signal and with the signal potential of the second terminal alternating about said reference potential comprising, in combination, a) analog-to-digital converter means (ADC) having at least one analog input representing said AC current, having a low and a high reference voltage input and having a range of operation starting with zero for an analog input equal to said low reference input voltage, b) a high ADC reference voltage connected to said high reference input, c) capacitive burden means connected from each said current signal second terminal to said current signal ground terminal thereby forming a low-pass filter with approximately 6 decibels per octave reduction in the amplitude of said signal harmonics, d) each said second current signal terminals being connected to said ADC analog inputs resulting in signals on said second terminals having a selected polarity which is the same as the polarity of said ADC high reference voltage, e) said ADC having said low reference input connected to each said AC signal ground terminal to set the change of signal polarity to said ADC zero, f) said ADC providing periodic non-zero digital samples proportional to said AC signals whenever the polarity of said AC signal is the same as said high reference voltage and providing digital samples which are zeros whenever said AC signal is not of the selected polarity, and g) means for receiving and processing said digital samples to make desired measurements of said signals using samples proportional to the selected polarity.

7. Apparatus for digitizing alternating current (AC) signals of the same frequency, each signal coming from a pair of terminals with the potential of one terminal being the ground reference for said signal and with the signal potential of the second terminal alternating about said reference potential comprising, in combination, a) analog-to-digital converter means (ADC) using an all-capacitive charge-distribution means for conversions using capacitors having fixed tolerances, said ADC having at least one analog input, having a low and a high voltage reference input and having a range of operation starting with zero for an analog input equal to said low reference input voltage, b) a high ADC reference voltage connected to said high reference input, c) at least one second signal terminal being connected to said ADC analog input resulting in signals on said second terminals having a selected polarity which is the same as the polarity of said ADC high reference voltage, d) said ADC having said low reference input connected to each said AC signal ground terminal to set a change of signal polarity to said ADC zero, e) said ADC providing at least one hundred periodic non-zero digital samples proportional to said AC signals whenever the polarity of said AC signal is the same as said high reference voltage and providing digital samples which are zeros whenever said AC signal is not of the selected polarity, and f) means for receiving and processing said digital samples to make desired measurements of said signal samples proportional to the selected polarity, to obtain accurate parameters of the entire signal.

8. In a method performed by an apparatus for providing selective measuring and controlling of electric power parameters, said apparatus including a processor and an analog to digital converter means (ADC) for receiving alternating current (AC) signals of the power frequency, said method consisting of the steps of:

a) obtaining periodic digital samples of said AC signals from said ADC and conveying said samples to said processor, b) determining zero to non-zero (znz) transistors in the value of said samples and thereby selecting samples representing a selected polarity of said AC signals, c) processing said samples to make a partial computation for a desire measurement using only samples of the selected polarity until a non-zero to zero (nzz) transition in the value of said samples is obtained, and d) stopping said periodic sampling and completing said computations to obtain desired signal measuring and controlling parameters.

9. The method as in claim 8 wherein step c) consists of:

c) squaring each said sample, forming the sum of said squares, counting the number of squares, and wherein step d) consists of:

d) dividing the sum of the squares by the number of samples, multiplying by the sampling period, taking the square root of the result and multiplying by two to obtain the rms amplitude of the entire signal.

10. The method as in claim 8 wherein step c) consists of:

c) forming the sum of said samples, counting the number of samples, and wherein step d) consists of:

d) dividing the sum of the samples by the number of samples, multiplying by the sampling period and multiplying by two to obtain the average amplitude of the entire signal.

11. In a method performed by an apparatus for providing selective measuring and controlling of electric power parameters, said apparatus including a processor and an analog to digital converter means (ADC) for receiving alternating current (AC) signals of the power frequency, method consisting of the steps of:
  a) obtaining from said ADC at least one hundred periodic digital samples of each said AC signal whenever the polarity of said signal is the same as the polarity of said high voltage reference and conveying said samples to said processor,
  b) determining a zero to non-zero (znz) transition in the value of said samples and thereby selecting samples representing one selected polarity of said AC signals,
  c) processing said samples to make a partial computation for a first desired measurement of a signal parameter until a non-zero to zero (nzz) transition in the value of said samples is obtained,
  d) stopping said periodic sampling and completing said computations to obtain desired signal parameters of at least one bit greater resolution in the measurement of said parameter as compared to the maximum resolution of the ADC.

12. In a method performed by an apparatus for providing selective measuring and controlling of electric power parameters, said apparatus including a processor and an analog to digital converter means (ADC) for receiving alternating current (AC) signals of the power frequency and for determining the phase angle between two received signals, said method consisting of the steps of:
  a) obtaining periodic digital samples of a first selected AC signal from said ADC and conveying said samples to said processor,
  b) determining a first zero to non-zero (znz) transition in the value of said samples of said first selected signal,
  c) determining a first non-zero to zero (nzz) transition in the value of said samples,
  d) counting the number of samples between said first znz transition and said first nzz transition,
  e) conveying samples of a second selected AC signal to said processor in place of said first selected AC signal,
  f) determining a second znz transition in the values of said samples of said second selected AC signal,
  g) determining a second nzz transition in the value of said samples of said second selected AC signal,
  h) counting the number of samples between second znz transition and said second nzz transition,
  i) determining the average of the results of steps d) and h), and
  j) using said average together with the period of said digital samples to determine the phase angle between the centers of said first selected signal and said second selected signal.

13. In a method performed by an apparatus for providing selective measuring and controlling of electric power parameters, said apparatus including a processor and an analog to digital converter means (ADC) for receiving alternating current (AC) signals of the power frequency, the method consisting of the steps of:
  a) obtaining periodic digital samples of a first selected AC signal from said ADC and conveying said samples to said processor,
  b) determining first zero to non-zero (znz) transitions in the value of said samples of said first selected signal and thereby selecting samples representing one selected polarity of said AC signal,
  c) processing said samples to make a partial computation for a first desired measurement of the first selected AC signal using only samples of the selected polarity until a first non-zero to zero (nzz) transition in the value of said samples is obtained,
  d) counting the number of samples between said first znz transition and said first nzz transition,
  e) conveying samples of a second selected AC signal to said ADC in place of said first selected AC signal,
  f) obtaining periodic digital samples of said second selected AC signal from said ADC and conveying said samples to said processor,
  g) determining a second znz transition in the values of said samples of said second selected AC signal and thereby selecting samples representing said selected polarity of said AC signal,
  h) processing said samples of said second selected signal to make a partial computation for a second desired measurement of said second selected AC signal using only samples of the selected polarity until a second nzz transition in the value of said samples is obtained,
  i) counting the number of samples between said second znz transition and said second nzz transition,
  j) stopping said periodic sampling,
  k) determining the average of the results of steps d) and i),
  l) using said average together with the period of said digital samples to determine the phase angle between said first selected signal and said second selected signal,
  m) completing the computation of the first desired measurement to obtain parameters of the first selected signal, and
  n) completing the computation of the second desired measurement to obtain parameters of the second selected signal.

* * * * *

UNITED STATES PATENT AND TRADEMARK OFFICE
CERTIFICATE OF CORRECTION

PATENT NO. : 5,315,527
DATED : May 24, 1994
INVENTOR(S) : Robert W. Beckwith

It is certified that error appears in the above-indentified patent and that said Letters Patent is hereby corrected as shown below:

Columns 25-26, lines 23-54 and 1-53, claims 12 and 13, should read as follows:

Claim 12. In a method performed by an apparatus for providing selective measuring and controlling of electric power parameters, said apparatus including a processor and an analog to digital converter means (ADC) for receiving alternating current (AC) signals of the power frequency and for determining the phase angle between two received signals, said method consisting of the steps of:

a) obtaining periodic digital samples of a first selected AC signal from said ADC and conveying said samples to said processor, b) determining a first zero to non-zero (znz) transition in the value of said samples of said first selected signal, c) determining a first non-zero to zero (nzz) transition in the value of said samples, "d) counting the number of samples between said first znz transition and said first nzz transition,"

"e)"--d)-- conveying samples of a second selected AC signal to said processor in place of said first selected AC signal, "f)"--e)-- determining a second znz transition in the values of said samples of said second selected AC signal, "g)"--f)-- determining a second nzz transition in the value of said samples of said second selected AC signal, "h)"--g) counting the number of samples betwee said first znz transition and said second znz transition,-- h) counting the number of samples between said "second znz" --first nzz-- transition and said second nzz transition, i) determining the average of the results of steps "d)",--g)-- and h), and j) using said average together with the period of said digital samples to determine the phase angle between the centers of said first selected signal and said second selected signal.

UNITED STATES PATENT AND TRADEMARK OFFICE
CERTIFICATE OF CORRECTION

PATENT NO. : 5,315,527
DATED : May 24, 1994
INVENTOR(S) : Robert W. Beckwith

It is certified that error appears in the above-indentified patent and that said Letters Patent is hereby corrected as shown below:

Claim 13. In a method performed by an apparatus for providing selective measuring and controlling of electric power parameters, said apparatus including a processor and an analog to digital converter means (ADC) for receiving alternating current (AC) signals of the power frequency, the method consisting of the steps of:

a) obtaining periodic digital samples of a first selected AC signal from said ADC and conveying said samples to said processor, b) determining first zero to non-zero (znz) transitions in the value of said samples of said first selected signal and thereby selecting samples representing one selected polarity of said AC signal, c) processing said samples to make a partial computation for a first desired measurement of the first selected AC signal using only samples of the selected polarity until a first non-zero to zero (nzz) transition in the value of said samples is obtained, "d) counting the number of samples between said first znz transition and said first nzz transition,"

"e)"--d)-- conveying samples of a second selected AC signal to said ADC in place of said first selected AC signal, "f)"--e)-- obtaining periodic digital samples of said second selected AC signal from said ADC and conveying said samples to said processor, "g)"--f)-- determining a second znz transition in the values of said samples of said second selected AC signal and thereby selecting samples representing said selected polarity of said AC signal,

UNITED STATES PATENT AND TRADEMARK OFFICE
CERTIFICATE OF CORRECTION

PATENT NO. : 5,315,527
DATED : May 24, 1994
INVENTOR(S) : Robert W. Beckwith

It is certified that error appears in the above-indentified patent and that said Letters Patent is hereby corrected as shown below:

(Claim 13 continued)

"h)"--g)-- processing said samples of said second selected signal to make a partial computation for a second desired measurement of said second selected AC signal using only samples of the selected polarity until a second nzz transition in the value of said samples is obtained,
    -- h) counting the number of samples between said first znz transition and said second znz transition,--
    i) counting the number of samples between said "second znz" --first nzz-- transition and said second nzz transition,
    j) stopping said periodic sampling,
    k) determining the average of the results of steps "d"--h)-- and i),
    l) using said average together with the period of said digital samples to determine the phase angle between said first selected signal and said second selected signal,
    m) completing the computation of the first desired measurement to obtain parameters of the first selected signal, and
    n) completing the computation of the second desired measurement to obtain parameters of the second selected signal.

Signed and Sealed this

Fourteenth Day of February, 1995

Attest:

BRUCE LEHMAN

Attesting Officer     Commissioner of Patents and Trademarks